United States Patent [19]
Abe

[11] Patent Number: 5,850,167
[45] Date of Patent: Dec. 15, 1998

[54] SURFACE ACOUSTIC WAVE DEVICE

[75] Inventor: Hidenori Abe, Toda, Japan

[73] Assignee: Kinseki, Limited, Tokyo, Japan

[21] Appl. No.: 750,501

[22] PCT Filed: Apr. 11, 1996

[86] PCT No.: PCT/JP96/01002

§ 371 Date: Mar. 20, 1997

§ 102(e) Date: Mar. 20, 1997

[87] PCT Pub. No.: WO96/32777

PCT Pub. Date: Oct. 17, 1996

[30] Foreign Application Priority Data

Apr. 11, 1995 [JP] Japan ................................. 7-109146

[51] Int. Cl.$^6$ ................................................. H03M 9/64
[52] U.S. Cl. ............... 333/194; 333/195; 310/313 B; 310/313 D
[58] Field of Search ................................. 333/193–196; 310/313 R, 313 B, 313 C, 313 D

[56] References Cited

U.S. PATENT DOCUMENTS 5,699,028  12/1997  Hiraishi et al. ............... 310/313 R X

FOREIGN PATENT DOCUMENTS

| | | | |
|---|---|---|---|
| 61-285814 A | 12/1986 | Japan | 333/195 |
| 63-269612 | 11/1988 | Japan . | |
| 2-202710 A | 8/1990 | Japan | 333/195 |
| 3-270309 A | 12/1991 | Japan | 333/193 |
| 5-129884 | 5/1993 | Japan . | |
| 6-169231 A | 6/1994 | Japan | 333/193 |
| 6-244676 | 9/1994 | Japan . | |
| 6-276048 A | 9/1994 | Japan | 333/193 |

OTHER PUBLICATIONS

A translated copy of the International Search Report for corresponding application No. PCT/JP96/01002; Jul., 1996.

*Primary Examiner*—Robert Pascal
*Assistant Examiner*—Barbara Summons
*Attorney, Agent, or Firm*—Dickstein Shapiro Morin & Oshinsky, LLP

[57] ABSTRACT

A first electrode structure row formed on a piezoelectric substrate, and including N1 pairs of an input/output IDT, N2 pairs of a connection IDT, and reflectors is cascade-connected to a second electrode structure row formed on the piezoelectric substrate, and including N1 pairs of an input/output IDT, N2 pairs of a connection IDT, and reflectors, the connection IDT of the first electrode structure row, and the connection IDT of the second electrode structure row being arranged electrically symmetric with respect to the cascade-connected plane. The pair number N1 of the input/output IDT is different from the pair number N2 of the connection IDT. When a normalized electrode film thickness of the input/output IDT and the connection IDT is represented by h/L, the pair number N1 of the input/output IDT satisfies the following formula $$43-11(h/L) \leq N1 \leq 61-11(h/L).$$

The surface acoustic wave device can realize good filter characteristics of low insertion losses, small amplitude ripples and group delay time ripples, relatively large specific bandwidths, good shape factors, large attenuation, and is useful as filters for use in mobile communications, etc., especially as intermediate frequency filters for use in digital communications.

24 Claims, 19 Drawing Sheets

SURFACE ACOUSTIC WAVE DEVICE

[TECHNICAL FIELD]

The present invention relates to a surface acoustic wave device which is used in intermediate frequency filters, etc. of mobile communication equipments.

[BACKGROUND ART]

Filters in the form of surface acoustic wave devices are used in communication equipments, broadcasting equipments, measuring devices, etc. because of their small sizes, lightness and high achievement. Conventionally, intermediate frequency filters used in the analog communication system have been required narrow-band characteristics, in addition, small deviation of center frequency due to temperatures, and large attenuation characteristics. In this application transversal surface acoustic wave filters using ST cut quartz substrates and having 3 dB specific band widths (hereinafter abbreviated as specific band widths) of 0.33–1.0% have been used.

The analog communication system is being changed to the digital communication system in mobile communication for effective use of frequencies and confidentiality. Intermediate-frequency filters used in the digital communication system have a relatively wide specific band width of 0.2–0.5%, flat group delay times, and attenuation characteristics which exceed those of the inter-mediate filters of the analog communication system. Particularly portable instruments for the mobile communication must be compact and require low power consumption, and the surface acoustic wave filters must be accordingly compact, have low minimum insertion loses, attenuation characteristics, and good shape factors. For these requirements various studies have been conventionally made.

As a first conventional art, transversal surface acoustic wave filters having two interdigital transducers are known. These filters have a merit that required amplitude characteristics and phase characteristics can be designed independently of each other.

The transversal surface acoustic wave filters, however, have large insertion loses. To obtain specific band widths of 0.2–0.5%, they require a large number of electrodes, which increases device size and makes attenuation characteristics insufficient.

As surface acoustic wave filters having low losses and compact sizes, surface acoustic wave resonator filters are known. The surface acoustic wave resonator filters have had their structures decided simply on consideration of insertion loss in the passband and attenuation characteristics, and have found it difficult to obtain the required group delay time characteristics.

As a second conventional art, a two terminal pair surface acoustic wave filter using a plurality of pairs of interdigital transducers (IDTs) and reflectors is described in Yahei Oyamada, Masakichiro Yoshikawa, "TWO TERMINAL PAIR SURFACE ACOUSTIC WAVE RESONATOR USING A PLURALITY OF PAIRS OF IDTS", Journal of Japan Acoustics Association, vol. 33, No. 10, pp. 557–564, October, 1977.

This filter comprises two interdigital transducers of a perfect periodical structure and reflectors arranged outside of both ends of two interdigital transducers formed on a quartz substrate. It has a 1.25% normalized aluminium film thickness, a 15 L aperture length (L is a reflector pitch), 300 pairs of the interdigital electrodes of the IDTS, and 200 electrodes of the reflectors. When a terminal impedance is 50 Ω, filter characteristics of a 3 dB minimum insertion loss, a 0.033% specific band width, and a 30 dB attenuation level are obtained. Furthermore, to obtain good attenuation levels, two above-described electrode structure rows are connected in cascade. Filter characteristics of a 6 dB minimum insertion loss, a 0.028% specific band width and a 70 dB attenuation level are obtained.

Group delay time characteristics of this conventional art example, however, are unknown, and the specific band width is narrow. The insertion loss is large, and decrease of the insertion loss has been required.

As a third conventional art is known a longitudinal double mode SAW resonator filter which is described in Masaki Tanaka, Takao Morita, Kazuo Ono, and Yuzo Nakazawa, "HIGH FREQUENCY LOW LOSS FILTER PROVIDED BY CONCATENATED DOUBLE MODE SAW RESONATOR", Technical Report of Toyo Tsushinki, No. 39, pp. 9–16, June, 1986.

This filter comprises two interdigital transducers providing 50 pairs of electrodes, and reflectors each having 400 electrodes outside of both ends thereof, arranged on an X-cut 112°-Y propagating lithium tantalate substrate. The technical report describes that this filter is similar in structure and operational principle to a monolithic crystal filter using thickness shear modes oscillations of an AT cut quartz. Accordingly, a double mode filter using a symmetric mode and an antisymmetric mode, similar to those of the monolithic crystal filter, is possible.

This filter example achieved high reflectances of the antisymmetric mode in the edge of electrodes, which had a 2.5% normalized aluminium film thickness, a 50 LL aperture length (LL is a pitch of the interdigital electrodes), and the interdigital electrodes cosine-weighted, and a reflector pitch a little wider than that of the interdigital electrode. That is, the energy trapping effect for the antisymmetric mode, which is the higher mode, is improved.

Furthermore, to obtain good attenuation levels, two above-described electrode structure rows are connected in cascade, and composite filter characteristics of a 2.2 dB minimum insertion loss, a 0.24% specific band width and a 75 dB attenuation level can be obtained. The terminating impedance is 50 Ω.

In this conventional art, however, there are some spurious signals on the lower part of the passband. Because of the spurious signals especially near the band, this filter is not applicable for use as an intermediate frequency filter.

This example does not consider group delay time characteristics. The inventors of the present invention studied group delay time characteristics, which is an important evaluation item for intermediate frequency filters. In the filter of this type of conventional art, which has an aperture length as large as 50 LL, transverse modes intrinsically take place although the transverse modes are suppressed by cosine-weighting the interdigital electrodes. Accordingly, the group delay times have so large ripples that the filter is found practically unusable as an intermediate frequency filter.

The operational principle of such a double mode filter is well known in the energy trapping monolithic crystal filters using bulk oscillations. A double mode monolithic crystal filter comprising a positive and a negative electrodes on the front surface and back surface of an AT cut quartz substrate of a prescribed thickness can have good passband characteristics by assuming electrically equivalent symmetrical lattice-type circuits using symmetry with respect to the center of a pair of electrodes, and adjusting the positions of a resonance frequency and of an antiresonance frequency for a lattice arm impedance indicative of the symmetric mode and a serial arm impedance indicative of the antisymmetric mode.

Here, in order to reduce ripples in a passband, it is known that the so-called "frequency matching" is effective. However, it is also known that the agreement of antiresonance frequencies on high frequency sides of the serial arm impedance and of the lattice arm impedance with some resonance frequencies is not required, but the flatness of image impedance of the filter is required.

Here, image parameters of surface acoustic wave filters will be studied with reference to a design method of a monolithic crystal filter using bulk oscillations, based on image impedance.

First, in a transversal surface acoustic wave filter, because of intrinsic loss due to bi-directional loss of the interdigital electrodes, the filter cannot act as a low-loss filter even if the filter is designed with consideration to matching its image impedances with terminating impedance at the electric input and output terminals. Rather, the image impedances have not been matched with each other so as to suppress spurious signals due to triple transit echoes.

In the energy trapping structure of the surface acoustic waves resonator filter or others, insertion loss in the surface acoustic wave filter is small, and electric reflection losses at the input and the output terminals are reduced by matching image impedances of the filter with terminating impedance at the input and output terminals, so that the filter can be a low loss filter. Generally, a transmission matrix elements of an electric equivalent circuit representing a surface acoustic wave filter are complex numbers, and image impedances thereof are also complex numbers.

A method for designing a SAW filter using the complex conjugate image impedance method by Woo Hokhoa et al. was published in 1989 (Woo Hokhoa, Masami Kasagi, Nobuyoshi Sakamoto, "Design of Matching Circuit by Conjugate Image Impedance Method (Application to SAW Filter)", Report of Electronic Information Communication Society, CPM89-72, pp. 14–24, 1989). This method is used in designing by the complex conjugate image impedance method a matching circuit of a surface acoustic wave filter of an IIDT structure formed in one surface acoustic wave propagation track. This publication describes that the frequency response of surface acoustic wave filters is flat in the passband by using a T-type matching circuit. Then, the matching circuit which is formed of an inductor and a capacitor has a complex conjugate image impedance value at the terminating frequency. Moreover, the terminating frequency is defined as a frequency having the largest insertion loss in the passband when surface acoustic wave filters are terminated at a complex conjugate image impedance which varies with frequencies. This report, however, does not discuss propagation constant, which is a part of the image parameters.

As a fourth conventional art is known a longitudinal double mode SAW filter described in Japanese Patent Publication No. Tokkohei 03-51330/1991.

This SAW filter comprises on an ST cut quartz substrate or a lithium tantalate substrate which has one surface acoustic wave propagation track, two interdigital transducers disposed serially adjacent to each other in direction of propagation, reflectors having a wider pitch than that of the interdigital transducers and disposed outside of both sides of two interdigital transducers. For the ST cut quartz substrate, pairs of the interdigital electrodes are below 600 pairs, and a normalized aperture length is above 5, and for the lithium tantalate substrate pairs of the interdigital electrodes are below 400 pairs, and a normalized aperture length is above 20. Specifically, on an ST cut quartz substrate aluminium film of a 2% normalized film thickness, an above 20 normalized length aperture, 200 pairs of interdigital electrodes and 500 electrodes of each reflector are formed, whereby a 0.2% specific bandwidth is obtained.

However, this example of the conventional art does not consider group delay time characteristics. Studies of the inventors of the present invention have found some spurious signals on the lower frequency side of a passband and found that especially the spurious signals near the passband result in degraded shape factors. To use this conventional filter as an intermediate frequency filter, it is necessary to suppress spurious signals near the passband. This conventional filter uses both the symmetric mode and the antisymmetric mode in the one surface acoustic wave propagation track. Therefore, the filter has symmetry with respect to the center of the one surface acoustic wave propagation track.

As a fifth conventional art is known the surface acoustic wave device described in Japanese Patent Laid-Open Publication No. Tokkaihei 07-95003/1995. This surface acoustic wave device including Ns pairs of input IDTs and Nf pairs of output IDTs defines a range of the sum Ns+Nf of the input IDT pairs and the output IDT pairs, and the surface acoustic wave device can be used as a surface acoustic wave filter having a flat group delay time, a relatively wide specific band width and a low insertion loss. However, as shown in FIGS. 9 to 14 of Japanese Patent Laid-Open Publication No. Tokkaihei 07-95003/1995, spurious signals are found near the lower frequency side of the passband, and no reference is made to the improvement of the spurious signals near the lower frequency side of the passband. In the control shown in FIGS. 15 to 17 of Japanese Patent Laid-Open Publication No. Tokkaihei 07-95003/195, no spurious signals occur near the lower frequency side of the passband, but characteristics (e.g., group delay time ripples and amplitude ripples) in the passband are still insufficient.

As a sixth conventional art is known a surface acoustic wave filter described in Japanese Patent Laid-Open Publication No. Tokkaisho 64-82706/1989. This surface acoustic wave filter has a 3IDTs structure including two output interdigital transducers disposed on both sides of an input interdigital transducer. This filter has a smaller number of pairs of the output electrode than a number of pairs of the input electrode, whereby the surface acoustic wave filter can have low loss and a narrow band. However, no reference is made to improvement of spurious signals near the lower frequency side of a passband.

As a seventh conventional art is known the acoustic wave transducer described in Japanese Patent Laid-Open Publication No. Tokkaihei 06-252693/1994. This acoustic wave transducer comprises an acoustic wave transducer including an IDT of N1 pairs in a first electrode structure row, and an acoustic wave transducer including an IDT of N2 pairs in a second electrode structure row, which are connected in cascade.

As an eighth conventional art is known the surface acoustic wave resonator filter described in Japanese Patent Laid-Open Publication No. Tokkaisho 59-37724/1984. The surface acoustic wave resonator filter can have low insertion loss and a narrow band by differing number of pairs of an input electrode from that of an output electrode, and differing pitches of the input electrodes from those of the output electrodes, so that resonance frequencies of the input electrodes and of the output electrodes match with each other. However, this conventional art has an electrode structure row without reflectors, and is intended to suppress spurious signals near the higher frequency side of the passband. This reference is not made to improvement of spurious signals near the lower frequency side of the passband and improvement of ripples in the passband.

Thus, the above-described conventional surface acoustic wave filters have failed to attain characteristics which are necessary for intermediate frequency filters to be used in digital communication systems, i.e., relatively wide specific bandwidths, large attenuation, especially absence of spurious signals near passband, good shape factors, small-sizes, low insertion losses and flat group delay times.

An object of the present invention is to provide a surface acoustic wave device having a flat group delay time, a relatively wide specific bandwidth, low insertion losses and shape factors, a large attenuation, suppression of spurious signals near the lower frequency side of the passband, and suppression of influence of ripples by the transverse mode.

[DISCLOSURE OF THE INVENTION]

In order to solve the above-described problems, the inventors of the present application studied applying the concept of energy trapping of a surface acoustic wave resonator presented by H. Shimizu in the 7th symposium on ULTRASONIC ELECTRONICS held in December, 1989 to a surface acoustic wave device comprising electrode structure row including two interdigital transducers and reflectors outside of the two interdigital transducers.

The concept of energy trapping of the surface acoustic wave resonator presented by H. Shimizu is as follow (Hiroshi Shimizu, "Energy Trapping in Piezoelectric Resonator", Resume of the Symposium on ULTRASONIC ELECTRONICS pp. 81–86, December, 1986, in Japanese).

First, in the energy trapping mode, oscillation energy is concentrated in a partial region of an oscillator having a simple shape, and the displacement and stress of oscillation can be found to be zero in regions which are to some extent distant therefrom. That is, the energy trapping mode is defined to be a resonance mode whose displacement is, in principle, asymptotic to zero. Dispersion characteristics of the periodic strip of the surface acoustic wave resonator has a stop band because of branched backward waves, and its propagation wave number is a complex number there.

The surface acoustic wave resonator including the grating reflectors on both sides of the interdigital transducers uses the energy trapping by complex branch. A pitch of the reflector electrodes is a little larger than that of the interdigital electrodes so that the lower frequency edge of the stopband of the interdigital electrodes is near the center frequency of the stopband of the reflector electrodes, whereby a propagation wave number at the reflectors is a complex number at the frequency which the wave number of the interdigital electrodes becomes real. Therefore, good energy trapping resonance mode can be realized.

When the interdigital electrodes and the reflectors are arranged at a continuous equal pitch, a propagation wave number in the interdigital electrodes is a complex number at the same frequency as that in the reflectors. Thus, when the interdigital electrodes short, the resonance mode is absent, and when the interdigital electrodes are opened, the energy of the antiresonance mode is trapped throughout the interdigital electrodes and the reflectors.

It is described that, because the resonance of multi-pair interdigital electrodes without reflectors occurs at a frequency which is slightly lower than the lower edge of the stopband, and a propagation wave number is a real number in the entire passband, surface acoustic waves are not completely reflected and, in principle, it does not happen that the surface acoustic waves have no loss, its resonance does not fall under the energy trapping.

This concept will be developed to a surface acoustic wave device comprising electrode structure rows each including two interdigital electrodes and reflectors on both sides thereof. A pitch of the reflectors is a little wider than that of the two interdigital electrodes, and the lower frequency edge of a stopband of the interdigital electrodes is located at the center frequency of a stopband of the reflectors, whereby a propagation wave number of the reflectors is a complex number at a frequency at which a propagation wave number of the interdigital electrodes is a real number, and a good energy trapping resonance mode can be realized. This state is called here the complete energy trapping.

When two interdigital electrodes are arranged at a pitch which is continuous to that of the reflectors, a propagation wave number of the interdigital electrodes is a complex number at the same frequency as that of the reflectors. It is considered that when the interdigital electrodes short, the resonance mode is absent, and when the interdigital electrodes are opened, the energy of the antiresonance mode is trapped throughout the interdigital electrodes and the reflectors.

When the conventional art are classified based on this thought, the first, the second and the eighth conventional art are not considered the complete energy trapping, and the third and the fourth conventional art are considered the complete energy trapping. It cannot be seen whether the rest of the conventional art are considered the complete energy trapping, because they do not refer to pitches of the reflectors and the interdigital electrodes.

In the complete energy trapping structure, it is considered that surface acoustic wave energy does not leak outside the surface acoustic wave filter, and energy of an antisymmetric mode similar to that of monolithic crystal filters with low losses is trapped, so that wide bands can be obtained.

On the other hand, it is known that smaller aperture lengths intrinsically suppress the transverse mode. In a case of lithium tetraborate, aperture lengths which are free from the problem of transverse mode spurious signals is below 12 L. In a case of ST cut crystal, such aperture lengths are below 15 L. In a case of X-cut 112° Y-propagating lithium tantalate, such aperture lengths are below 20 L. A problem with small aperture lengths is that matching of terminal impedances having real number values is impossible.

The surface acoustic wave device according to Control 1 includes the electrode structure row of FIG. 16 formed on a piezoelectric substrate of lithium tetraborate. The electrode structure includes two electrode structure rows connected in cascade.

A first electrode structure row 10 comprises, on a piezoelectric substrate, an input/output IDT 11, a connection IDT 12 having substantially the same pitch and the same pair number as the input/output IDT 11 and disposed on the right side of the input/output IDT 11, and reflectors 13, 14 disposed outside the input/output IDT 11 and the connection IDT 12.

A second electrode structure row 20 comprises, on the piezoelectric substrate, an input/output IDT 21, and a connection IDT 22 having substantially the same pitch and the same pair number as the input/output IDT 21 and disposed on the left side of the input/output IDT 21, and reflectors 23, 24 disposed outside the connection IDT 22 and the input/output IDT 21.

The connection IDT 12 of the first electrode structure row 10 and the connection IDT 22 of the second electrode structure row 20 are connected to each other by wiring to connect the first electrode structure row 10 and the second structure row 20 to each other in cascade connection.

In Control 1, the piezoelectric substrate is a 45°-rotated X-cut Z-propagating lithium tetraborate ($Li_2B_4O_7$). A pair number N1 of the input/output IDTs 11, 21, and a pair number N2 of the connection IDTs 12, 22 are 31.5, and an electrode number of the reflectors 13, 14, 23, 24 is 60. When a pitch of the reflectors 13, 14, 23, 24 is represented by L, a pitch of the input/output IDTs 11, 21, and of the connection IDTs 12, 22 is 0.9836 L, and a distance between the interdigital electrodes is 0.4918 L. A distance between the input/output IDTs 11, 21 and the connection IDTs 12, 22, and the reflectors 13, 14, 23, 24 is 0.4959 L. A normalized aluminium film thickness h/L of the electrodes is 1.7%. An aperture length W is 7 L, which is relatively small.

FIG. 17 shows complex conjugate image impedances and propagation wave number of Control 1, based on the input IDT (or the output IDT) of the surface acoustic wave device having two electrode structure rows connected in cascade, and FIG. 18 shows the frequency responses of Control 1. The frequency is a normalized frequency by a lower edge frequency of a stopband of the interdigital electrodes. The passband is defined by a frequency difference between the points which the extrapolation lines intersect the normalized frequency axis when real number parts of a propagation wave number are extrapolated. The complex conjugate image impedances of the surface acoustic wave device seen from the input IDT and those seen from the output IDT are the same in terms of their symmetry.

As shown in FIG. 17, complex conjugate image impedances of Control 1 have imaginary parts of 189–2043 Ω and real parts of 300–3280 Ω in the passband, and exhibits high frequency dependence. The frequency responses of Control 1 of FIG. 18 were measured with a terminating impedance at the input/output terminal set at 2000 Ω. As shown in FIG. 18, in Control 1, ripples remain in the passband.

The ripple of the frequency responses in the passband does not decrease even when the pair number of the input/output IDTs 11, 21 and the connection IDTs 12, 22 are equally changed. Ripples remain in the passband even when the passband is terminated at any of the real part values of the complex conjugate image impedances at any of the frequencies in the passband.

FIG. 18 shows complex conjugate image impedances seen from the input IDT (or the output IDT) of one of the electrode structure rows of the surface acoustic wave device, and also the complex conjugate image impedances seen from the connection IDT. The pair number of the input/output IDTs and that of the connection IDTs are equal to each other, and the complex conjugate image impedances seen from the input IDT (or the output IDT) and those seen from the connection IDTs are equal to each other.

As shown in FIG. 18, it is seen that the complex conjugate image impedances seen from the connection IDT have imaginary parts in the passband, and the matching at the cascade-connected plane is not sufficient. As shown in FIG. 17, it is seen that the real parts and the imaginary parts of the complex conjugate image impedances seen from the input/output terminal, especially the imaginary parts do not match with a 2000 Ω terminating impedance, which is a cause for the ripple in the passband.

The surface acoustic wave device according to Control 2 includes the electrode structure of FIG. 16 formed on a piezoelectric substrate of lithium tetraborate. The electrode structure includes two electrode structure rows connected in cascade. The electrodes of Control 2 have basically the same structure as those of the fourth conventional art although the piezoelectric substrate is different from that of the latter.

In Control 2 the piezoelectric substrate is a 45°-rotated X-cut Z-propagating lithium tetraborate ($Li_2B_4O_7$). A pair number N1 of the input/output IDTs 11, 21, and a pair number N2 of the connection IDTs 12, 22 are 29.5, and an electrode number of the reflectors 13, 14, 23, 24 is 60. When a pitch of the reflectors 13, 14, 23, 24 is represented by L, a pitch of the input/output IDTs 11, 21, and of the connection IDTs 12, 22 is 0.9836 L, and a distance between the interdigital electrodes is 0.4918 L. A distance between the input/output IDTs 11, 21 and the connection IDTs 12, 22, and the reflectors 13, 14, 23, 24 is 0.4959 L. A normalized aluminium film thickness h/L of the electrodes is 1.7%. An aperture length W is 350 L, which is relatively large.

FIG. 19 shows complex conjugate image impedances and propagation wave number of Control 2 seen from the input IDT (or output IDT) of the surface acoustic wave device having two electrode structure rows connected in cascade, and FIG. 20 shows the frequency responses of Control 2. The frequency responses of Control 2 shown in FIG. 20 were measured with a terminating impedance at the input/output terminal set at 50 Ω.

In FIG. 19, complex conjugate image impedances seen from the input IDT and those seen from the output IDT are the same in terms of their symmetry. Real parts of those in the passband are about 50 Ω, and imaginary parts thereof are about 0 Ω. The frequency responses obtained with a terminating impedance set at 50 Ω, as shown in FIG. 20, are good passband characteristics having relatively low ripple.

In this case, the electrode structure row in the surface acoustic wave propagation track is symmetric to the center between the input/output IDTs and the connection IDTs, and the complex conjugate image impedances seen from the connection IDTs on the surface acoustic wave propagation track as well as the complex conjugate image impedances seen from the input/output terminal has real parts of about 50 Ω and imaginary parts of about 0 Ω at the same passband. Accordingly, matching condition of complex conjugate impedances is satisfied on the cascade-connected plane. The frequency response of Control 2 are a 2 dB minimum insertion loss, a 0.56% specific bandwidth and a below 3 μsec group delay time ripple in the passband. Good filter characteristics can be obtained.

However, in control 2, as shown in FIG. 20, a high spurious signal 1 and a spurious signal 2 occur on the lower frequency side in a stopband of the reflectors. Because of, especially, the spurious signal 1, the shape factor is disadvantageous, which makes the surface acoustic wave device according to Control 2 unusable as an intermediate frequency filter for interdigital signals which requires good shape factors.

In Control 2, the aperture length is as large as 350 L, which makes electrode strip resistance very influential and makes a minimum insertion loss higher. In a frequency range between 30 MHz and 100 MHz used as the first intermediate frequency of mobile communication equipments, the electrodes are longer, which results in increased sizes of the machines and instruments.

FIG. 20, which is a graph of results of a numerical simulation, does not show influence of the transverse mode.

In a case of an actual surface acoustic wave device, ripples in the passband due to the transverse mode takes place. Even though the ripples can be a little suppressed by cosine-weighting, there is a problem that the ripples in the passband are intrinsically present. Especially group delay time ripple is large, which makes it impossible to use Control 2 as an intermediate frequency filter.

In the design method using the image parameter of the generally known filter theory, a passband is defined to be a frequency range in which real parts of propagation wave number are zero, but as apparent in FIG. 19, real parts of the propagation wave number which are a part of complex conjugate image parameters of the surface acoustic wave filters do not become zero all over the frequency range. Then, in the specification of the present application, based on the thought that a minimum value of an envelope of real parts of propagation wave number corresponds to the case that real parts of the propagation wave number is zero in the conventional filter theory, as shown in FIG. 19, a frequency range between the positions where the extrapolation lines of real parts of the propagation wave number intersect the normalized frequency axis is defined as a bandwidth.

Considering that in the electrode arrangement in which two electrode structure rows are connected in cascade, as shown in FIG. 16, a state that is terminated at a complex conjugate image impedance having an imaginary part at the input/output terminal is the best matched condition, the inventors studied a preferable electrode structure.

In consideration of matching complex conjugate image impedances in the cascade-connected plane, it is preferable that complex conjugate image impedances in the cascade-connected plane are real numbers. It is preferable that image impedance seen from the input/output IDTs, and that seen from the connection IDTs are asymmetric to each other on a surface acoustic wave propagation track, because, as described above, complex conjugate image impedances having imaginary parts are matched at the input/output terminal. Based on studies of the fourth conventional art and Control 2, it is seen that, in the surface acoustic wave filters, when the electrode structure rows are symmetric to each other, the complex conjugate image impedances are symmetric.

Based on these findings, the inventors had an idea that the electrode structure row of a surface acoustic wave filter is made asymmetric to make complex conjugate image impedances asymmetric. Based on this idea, the inventors made the present invention.

The surface acoustic wave device according to the present invention comprises: a piezoelectric substrate; a first electrode structure row formed on the piezoelectric substrate, and including N1 pairs of input/output IDT, N2 pairs of a connection IDT disposed near one side of the input/output IDT, and two reflectors disposed outside the input/output IDT and the connection IDT; and a second electrode structure row formed on the piezoelectric substrate, and including N1 pairs of input/output IDT, N2 pairs of a connection IDT disposed near one side of the input/output IDT, and two reflectors disposed outside the input/output IDT and the connection IDT, the second electrode structure row being cascade-connected to the first electrode structure row, the connection IDT of the first electrode structure row, and the connection IDT of the second electrode structure row being arranged electrically symmetric with respect to the cascade-connected plane, when the surface acoustic wave device is represented by an electrically symmetric lattice-type circuit including a lattice arm impedance and a serial arm impedance, a passband being formed by using at least one resonance point and at least one antiresonance point of the lattice arm impedance, and at least one resonance point and at least one antiresonance point of the serial arm impedance, the pair number N1 of the input/output IDT being different from the pair number N2 of the connection IDT.

In the above-described surface acoustic wave device, it is preferable that at least two resonance points and at least one antiresonance point of the lattice arm impedance, and at least two resonance points and at least two antiresonance points of the serial arm impedance are used to form the passband.

The surface acoustic wave device according to the present invention comprises: a piezoelectric substrate; a first electrode structure row formed on the piezoelectric substrate, and including N1 pairs of input/output IDT, N2 pairs of a connection IDT disposed near one side of the input/output IDT, and two reflectors disposed outside the input/output IDT and the connection IDT; and a second electrode structure row formed on the piezoelectric substrate, and including N1 pairs of input/output IDT, N2 pairs of a connection IDT disposed near one side of the input/output IDT, and two reflectors disposed outside the input/output IDT and the connection IDT, the second electrode structure row being cascade-connected to the first electrode structure row, the connection IDT of the first electrode structure row, and the connection IDT of the second electrode structure row being arranged electrically symmetric with respect to the cascade-connected plane, the pair number N1 of the input/output IDT being different from the pair number N2 of the connection IDT, when a normalized electrode film thickness of the input/output IDT and the connection IDT is represented by h/L, the pair number N1 of the input/output IDT satisfying the following formula $$43-11(h/L) \leq N1 \leq 61-11(h/L).$$

In the above-described surface acoustic wave device, it is preferable that the pair number N1 of the input/output IDT satisfies the following formula $$50-11(h/L) \leq N1 \leq 59-11(h/L).$$

The surface acoustic wave device according to the present invention comprises: a piezoelectric substrate; a first electrode structure row formed on the piezoelectric substrate, and including N1 pairs of input/output IDT, N2 pairs of a connection IDT disposed near one side of the input/output IDT, and two reflectors disposed outside the input/output IDT and the connection IDT; and a second electrode structure row formed on the piezoelectric substrate, and including N1 pairs of input/output IDT, N2 pairs of a connection IDT disposed near one side of the input/output IDT, and two reflectors disposed outside the input/output IDT and the connection IDT, the second electrode structure row being cascade-connected to the first electrode structure row, the connection IDT of the first electrode structure row, and the connection IDT of the second electrode structure row being arranged electrically symmetric with respect to the cascade-connected plane, the pair number N1 of the input/output IDT being different from the pair number N2 of the connection IDT, when a normalized electrode film thickness of the input/output IDT and the connection IDT is represented by h/L, a ratio N2/N1 between the pair number N2 of the connection IDT and the pair number N1 of the input/output IDT satisfying the following formula $$0.542-0.021(h/L)+0.029(h/L)^2 \leq N2/N1 \leq 0.734-0.028(h/L)+0.029(h/L)^2.$$

In the above-described surface acoustic wave device, it is preferable that a ratio N2/N1 of the pair number N2 of the connection IDT and the pair number N1 of the input/output IDT satisfying the following formula $0.597-0.020(h/L)+0.027(h/L)^2 \leq N2/N1 \leq 0.690-0.032(h/L)+0.031(h/L)^2$.

The surface acoustic wave device according to the present invention comprises: a piezoelectric substrate; a first electrode structure row formed on the piezoelectric substrate, and including N1 pairs of input/output IDT, N2 pairs of a connection IDT disposed near one side of the input/output IDT, and two reflectors disposed outside the input/output IDT and the connection IDT; and a second electrode structure row formed on the piezoelectric substrate, and including N1 pairs of input/output IDT, N2 pairs of a connection IDT disposed near one side of the input/output IDT, and two reflectors disposed outside the input/output IDT and the connection IDT, the second electrode structure row being cascade-connected to the first electrode structure row, the connection IDT of the first electrode structure row, and the connection IDT of the second electrode structure row being arranged electrically symmetric with respect to the cascade-connected plane, the pair number N1 of the input/output IDT being different from the pair number N2 of the connection IDT, when a normalized electrode film thickness of the input/output IDT and the connection IDT is represented by h/L, a ratio N2/N1 between the pair number N2 of the connection IDT and the pair number N1 of the input/output IDT satisfying the following formula $0.542-0.021(h/L)+0.029(h/L)^2 \leq N2/N1 \leq 0.734-0.028(h/L)+0.029(h/L)^2$ the pair number of the input/output IDT satisfying the following formula $43-11(h/L) \leq N1 \leq 61-11(h/L)$.

In the above-described surface acoustic wave device, it is preferable that a ratio N2/N1 of the pair number N2 of the connection IDT and the pair number N1 of the input/output IDT satisfying the following formula $0.597-0.020(h/L)+0.027(h/L)^2 \leq N2/N1 \leq 0.690-0.032(h/L)+0.031(h/L)^2$, the pair number N1 of the input/output IDT satisfies the following formula $50-11(h/L) \leq N1 \leq 59-11(h/L)$.

The surface acoustic wave device according to the present invention comprises: a piezoelectric substrate; a first electrode structure row formed on the piezoelectric substrate, and including N1 pairs of input/output IDT, N2 pairs of a connection IDT disposed near one side of the input/output IDT, and two reflectors disposed outside the input/output IDT and the connection IDT; and a second electrode structure row formed on the piezoelectric substrate, and including N1 pairs of input/output IDT, N2 pairs of a connection IDT disposed near one side of the input/output IDT, and two reflectors disposed outside the input/output IDT and the connection IDT, the second electrode structure row being cascade-connected to the first electrode structure row, the connection IDT of the first electrode structure row, and the connection IDT of the second electrode structure row being arranged electrically symmetric with respect to the cascade-connected plane, the pair number N1 of the input/output IDT being different from the pair number N2 of the connection IDT, when complex conjugate image impedances Zo at the center frequency fo of a passband is represented by $Zo=R(fo)+jI(fo)$, and further the normalized frequency axis is divided in n sections within the passband, and a complex conjugate image impedance Z(fi) of a frequency at each point fi is represented by $Z(fi)=R(fi)+jI(fi)$ $(i=1, 2, 3, \ldots, n)$, a square deviation of normalized complex conjugate image impedance DCII expressed by the following formula $$DCII = \left\{ \sum_{i=1}^{n} (R(fi) - R(fo))^2 \right\}^{1/2} /(nR(fo)) + \left\{ \sum_{i=1}^{n} (I(fi) - I(fo))^2 \right\}^{1/2} /(nI(fo))$$

satisfies the following formula $0 \leq DCII \leq 0.2$.

In the above-described surface acoustic wave device, it is preferable that the square deviation of normalized complex conjugate image impedance DCII satisfies $0 \leq DCII \leq 0.13$.

In the above-described surface acoustic wave device, it is preferable that the piezoelectric substrate is a lithium tetraborate substrate.

[BEST MODE FOR CARRYING OUT INVENTION]

The surface acoustic wave device according to a first embodiment of the present invention will be explained with reference to the drawings.

Figure 1:
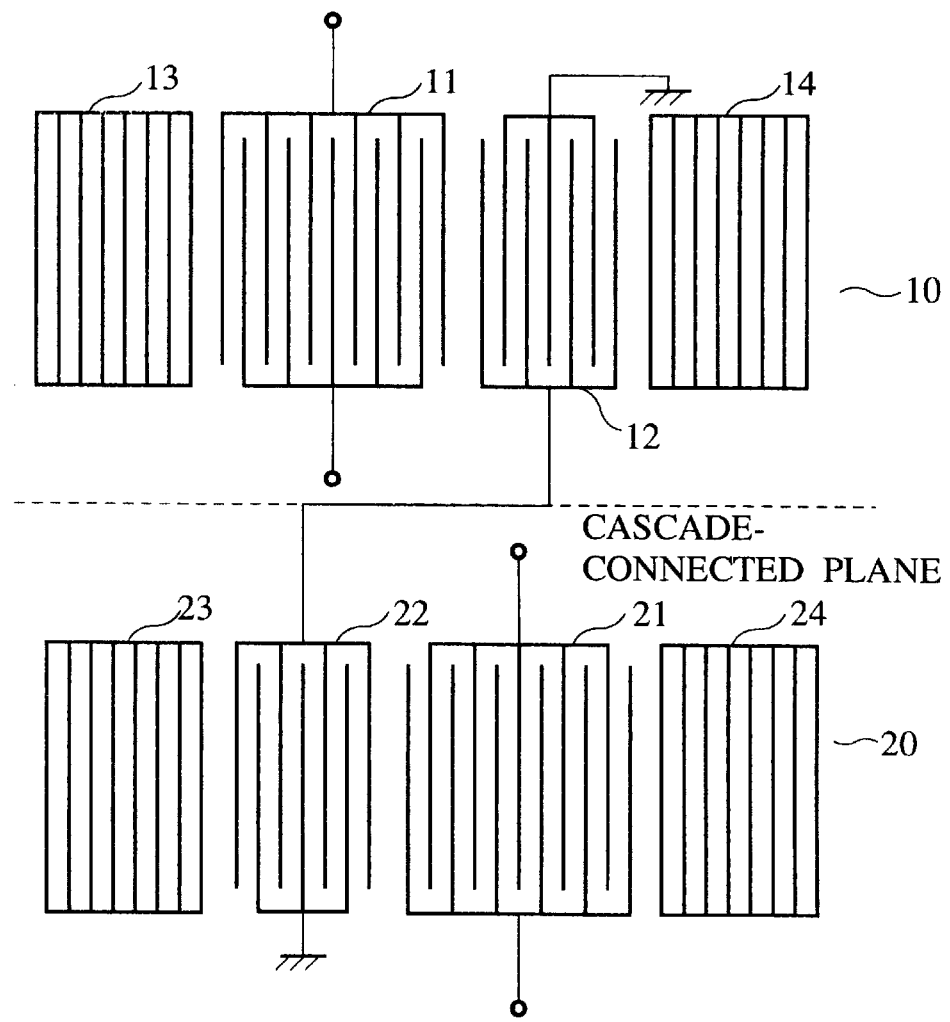
FIG. 1 is a view of the electrode structure of the surface acoustic wave device according to one embodiment of the present invention.

The surface acoustic wave device according to the present embodiment includes the electrode structure row shown in FIG. 1 formed on a piezoelectric substrate of lithium tetraborate single crystal. Two surface acoustic wave propagation tracks are provided by electrode structure rows 10, 20 on the piezoelectric substrate.

A first electrode structure row 10 includes, on the piezoelectric substrate, an input/output IDT 11 of N1 pairs, a connection IDT 12 of N2 pairs which has substantially the same pitch and a different number of pairs and is disposed on the right side of the input/output IDT 11, and reflectors 13, 14 disposed outside the input/output IDT 11 and the connection IDT 12.

A second electrode structure row 20 includes, on the piezoelectric substrate, an input/output IDT 21 of N1 pairs, a connection IDT 22 of N2 pairs which has substantially the same pitch and a different number of pairs and is disposed on the left side of the input/output IDT 21, and reflectors 23, 24 disposed outside the input/output IDT 21 and the connection IDT 22.

The connection IDT 12 of the first electrode structure row 10 and the connection IDT 22 of the second electrode structure row 20 are connected to each other by wiring formed on the piezoelectric substrate to connect in cascade the first electrode structure row 10 and the second electrode structure row 20. The other ends of the connection IDT 12 and of the connection IDT 22 are grounded. The connection IDT 12 and the connection IDT 22 may be connected to each other by wiring outside the piezoelectric substrate.

A pitch LL of the IDT and that L of the reflector are twice a distance between adjacent ones of the electrodes, usually a center distance between adjacent ones of the electrodes. A pair number of the IDT is given by counting matched two electrodes as one pair, and an unmatched one electrode is counted as a 0.5 pair. A distance Li between the IDTs is a center distance between the outermost electrodes of the respective IDT and electrodes of the reflectors which are outermost electrodes of the associated reflectors.

A metallization ratio which is a ratio of the electrodes formed on the substrate in the direction of propagation of surface acoustic waves in the IDT is 2xLidt/LL when a width of the interdigital electrodes is represented by Lidt. A metallization ratio which is a ratio of the electrodes formed on the substrate in the direction of propagation of surface acoustic waves in the reflectors is 2xLref/L when a width of the electrodes is represented by Lref. A thickness h/L of normalized aluminium film is a value given by dividing a film thickness h of the electrodes by a pitch L of the reflectors. An aperture length is a maximum value of overlapping widths between the electrodes of the respective IDT.

In the surface acoustic wave device having such structure, a first matter, suppression of spurious signals in a lower frequency side of a passband will be discussed.

As the piezoelectric substrate, a 45°-rotated X-cut Z-propagation lithium tetraborate single crystal substrate is used. The reflectors 13, 14, 23, 24 have 60 electrodes. When a pitch of the reflectors 13, 14, 23, 24 is represented by L, a pitch of the interdigital electrodes of the input/output IDTs 11, 21 and the connection IDTs 12, 22 is 0.9836 L. A distance between the interdigital electrodes is 0.4918 L. A distance between the input/output IDTs 11, 21 and the connection IDTs 12, 22, and their associated reflectors 13, 14; 23, 24 is 0.4959 L. A normalized aluminium film thickness h/L of the electrodes is 1.7%.

Figure 3:
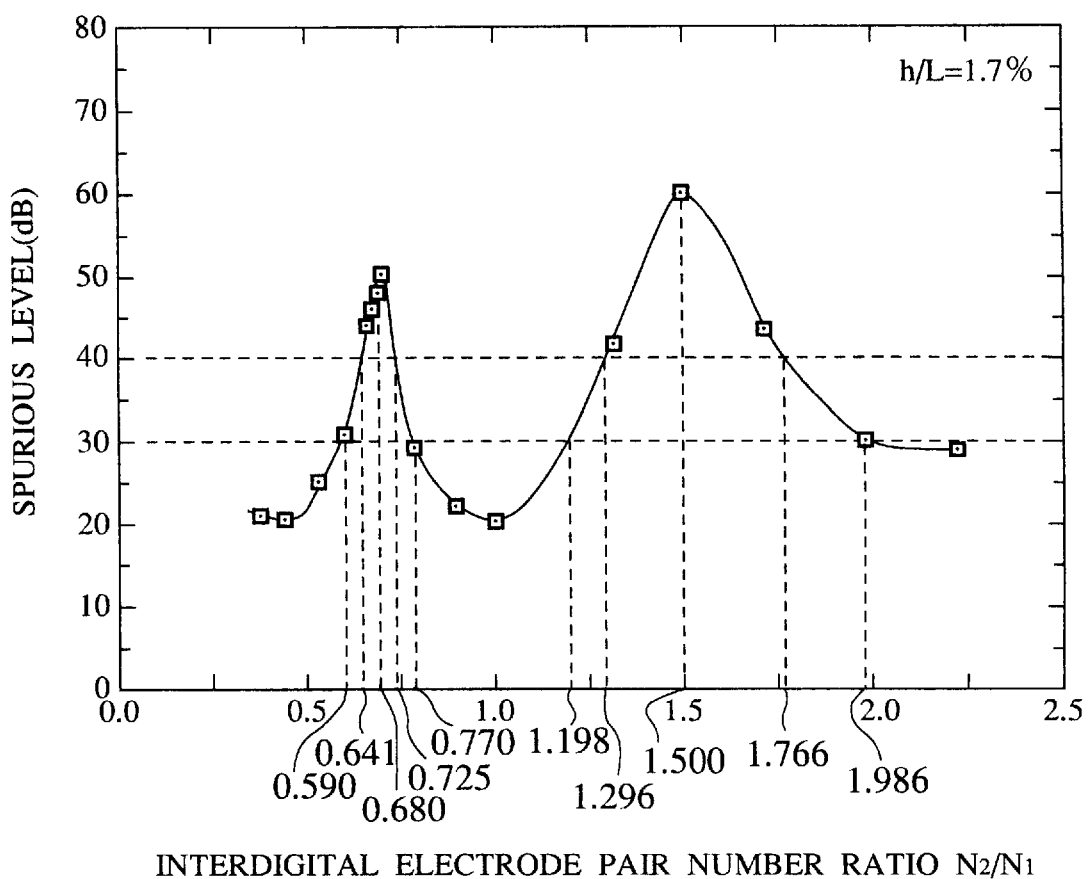
FIG. 3 is a graph of spurious level changes in the lower frequency side of a passband in the surface acoustic wave device according to the embodiment of the present invention with a 1.7% normalized aluminium film thickness h/L, with a pair number N1+N2 of interdigital electrodes set constant, and with an interdigital electrode pair number ratio N2/N1 varied.

FIG. 3 shows changes of spurious signal levels occurring when a pair ratio N2/N1 is changed, where a pair number ratio N2/N1 is given by dividing a pair number N2 of the connection IDTs 12, 22 by a pair number N1 of the input/output IDTs 11, 21 with a sum N1+N2 of the pair number N1 of the input/output IDTs 11, 21 and the pair number of the connection IDTs 12, 22 set constant as 59 pairs. The terminating impedance is 50 Ω. Here a spurious signal level is a difference given by subtracting a minimum insertion loss from a maximum spurious signal value occurring in a lower frequency side near a passband.

As apparent in FIG. 3, to suppress the spurious signals on the lower frequency side to above 30 dB, an interdigital electrode pair ratio N2/N1 is set at 0.590–0.770 or 1.198–1.986. By suppressing the spurious signals on the lower frequency side to above 30 dB the surface acoustic wave filter can be one having good shape factor.

Furthermore, to suppress the spurious signals on the lower frequency side to above 40 dB, an interdigital electrode pair ratio N2/N1 is set at 0.641–0.725 or 1.296–1.766. By suppressing the spurious on the lower frequency side to above 40 dB the surface acoustic wave filter can be one having better shape factor.

Furthermore, by setting an interdigital electrode pair ratio N2/N1 at 0.680 or 1.500 the spurious signals on the lower frequency side can be most effectively suppressed.

Figure 4:
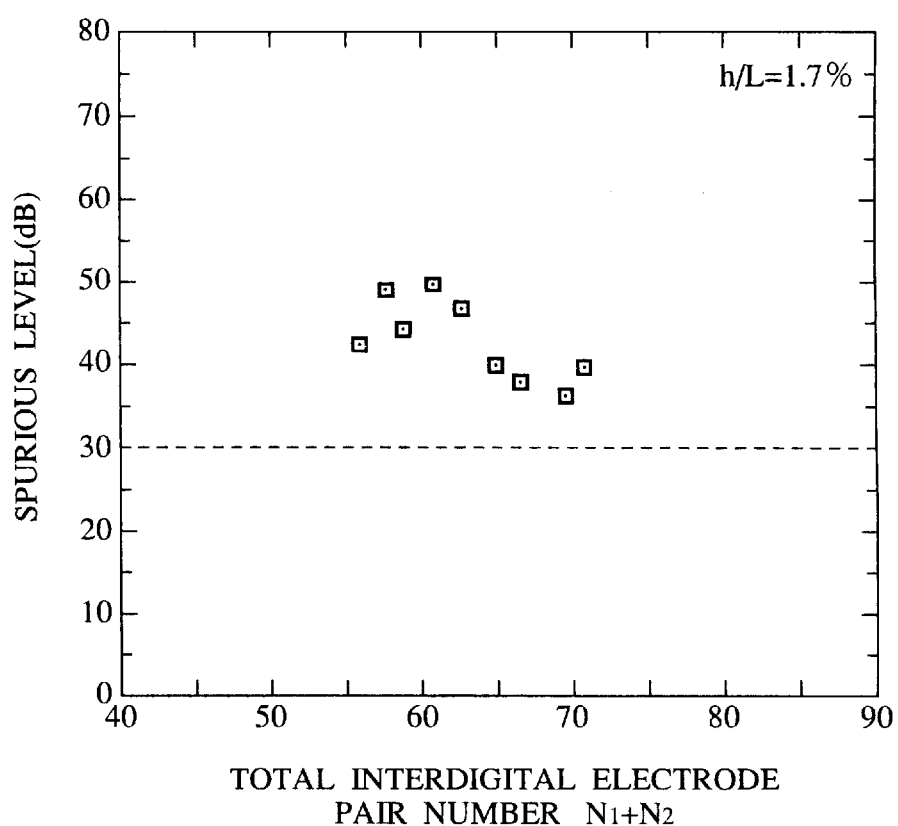
FIG. 4 is a graph of spurious level changes in the lower frequency side of a passband in the surface acoustic wave device according to the embodiment of the present invention with a 1.7% normalized aluminium film thickness h/L, with a pair number ratio N2/N1 of the interdigital electrodes set constant, and with a pair number N1+N2 of the interdigital electrodes varied.

Then, FIG. 4 shows changes of spurious signals on the lower frequency side occurring when a total pair number N1+N2 of the interdigital electrodes is changed with an interdigital electrode pair ratio N2/N1 set at a constant value within a range of 0.660–0.690 where the effect of suppressing the spurious signals on the lower frequency side is effective. The interdigital electrode pair ratio N2/N1 is in a set range because an interdigital electrode pair number has only a discrete value with a 0.5 pair as a minimum unit. As apparent in FIG. 4, the spurious signals on the lower frequency side is suppressed to above 30 dB.

Furthermore, the same measurement is conducted in cases that a normalized aluminium film thickness h/L is 1% and 3%.

Figure 5:
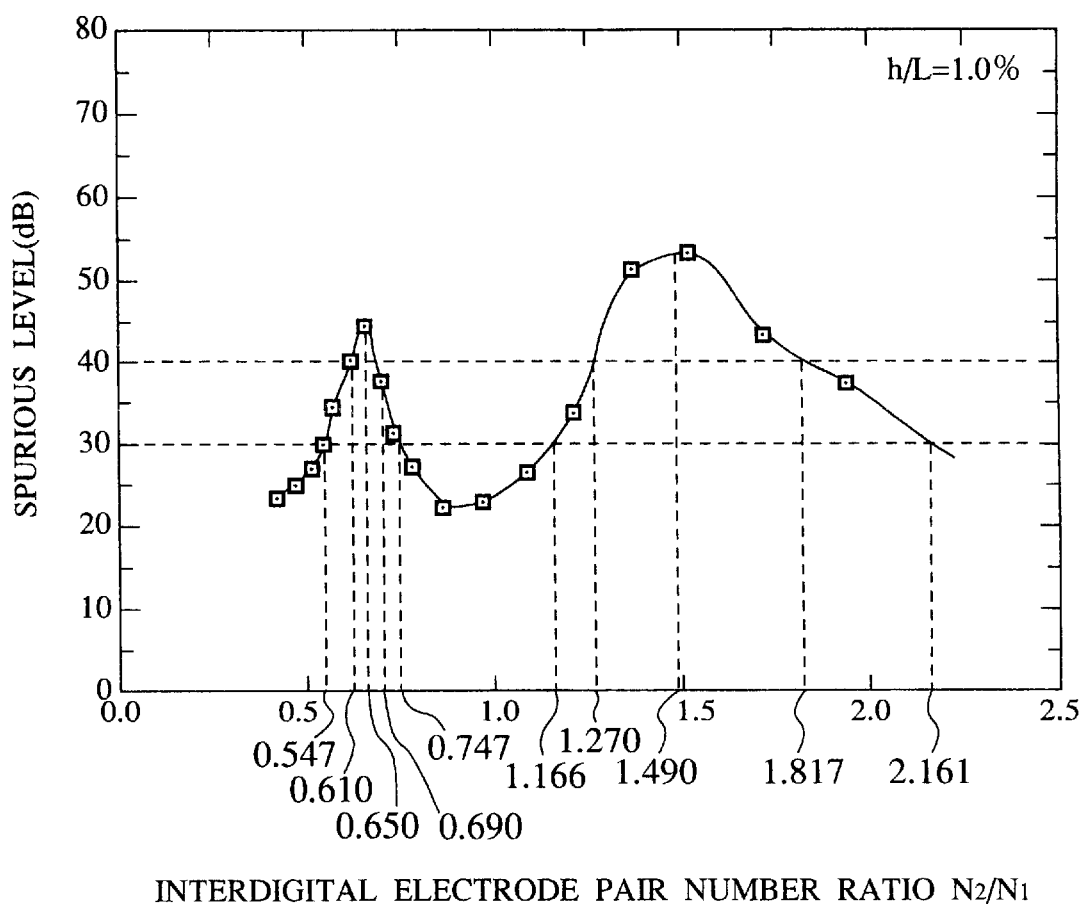
FIG. 5 is a graph of spurious level changes in the lower frequency side of a passband in the surface acoustic wave device according to the embodiment of the present invention with a 1.0% normalized aluminium film thickness h/L, with a pair number N1+N2 of the interdigital electrodes set constant, and with a pair number ratio N2/N1 of the interdigital electrodes varied.

FIG. 5 shows changes of spurious signals levels occurring when an interdigital electrode pair ratio N2/N1 is changed with a normalized aluminium film thickness h/L set at 1% and an interdigital electrode pair sum N1+N2 set constant at 59.

As apparent in FIG. 5, to suppress spurious signals on the lower frequency side to above 30 dB a pair number ratio N2/N1 of the interdigital electrodes is set in a range of 0.547–0.747 or 1.166–2.161. To suppress spurious signals on the lower frequency side to above 40 dB a pair number ratio N2/N1 of the interdigital electrodes is set in a range of 0.610–0.690 or 1.270–1.817. The spurious signals on the lower frequency side can be most effectively suppressed by setting a pair number ratio N2/N1 of the interdigital electrodes at 0.650 or 1.490.

Figure 6:
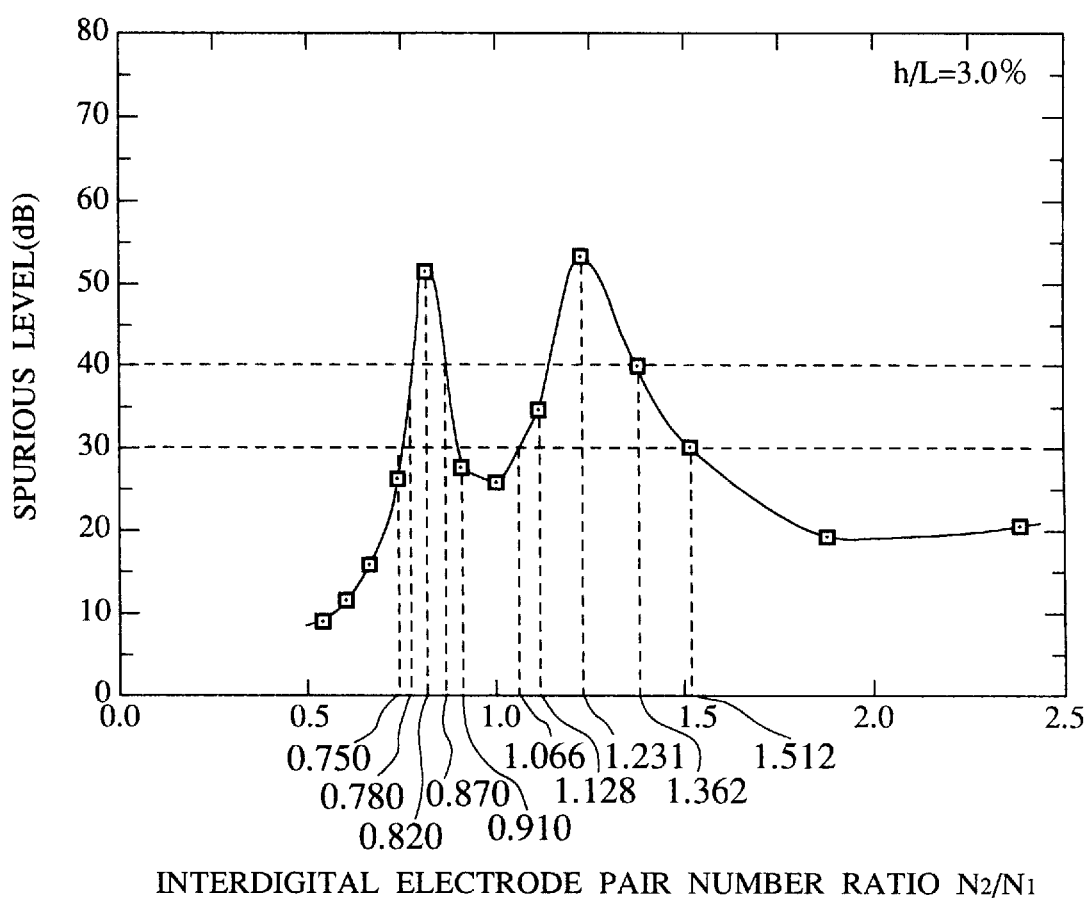
FIG. 6 is a graph of spurious level changes in the lower frequency side of a passband in the surface acoustic wave device according to the embodiment of the present invention with a 3.0% normalized aluminium film thickness h/L, with a pair number N1+N2 of the interdigital electrodes set constant, and with a pair number ratio N2/N1 of the interdigital electrodes varied.

FIG. 6 shows changes of spurious signal levels occurring when an interdigital electrode pair ratio N2/N1 is changed with a normalized aluminium film thickness h/L set at 3% and an interdigital electrode pair sum N1+N2 set constant at 59.

As apparent in FIG. 6, to suppress the spurious signals on the lower frequency side to above 30 dB a pair number ratio N2/N1 of the interdigital electrodes is set in a range of 0.750–0.910 or 1.066–1.512. To suppress the spurious signals on the lower frequency side to above 40 dB a pair number ratio N2/N1 of the interdigital electrodes is set in a range of 0.780–0.870 or 1.128–1.362. The spurious signals on the lower frequency side can be most effectively suppressed by setting a pair number ratio N2/N1 of the interdigital electrodes at 0.820 or 1.231.

However, in an aperture length range of 5 L to 12 L, when N2/N1 is larger than 1, the amplitude ripple is large. To sufficiently suppress spurious signals in the transverse mode it is necessary to set an aperture length at a range of 5 L to 12 L for lithium tetraborate single crystal. Hereinafter cases with N2/N1<1 will be described.

Figure 7:
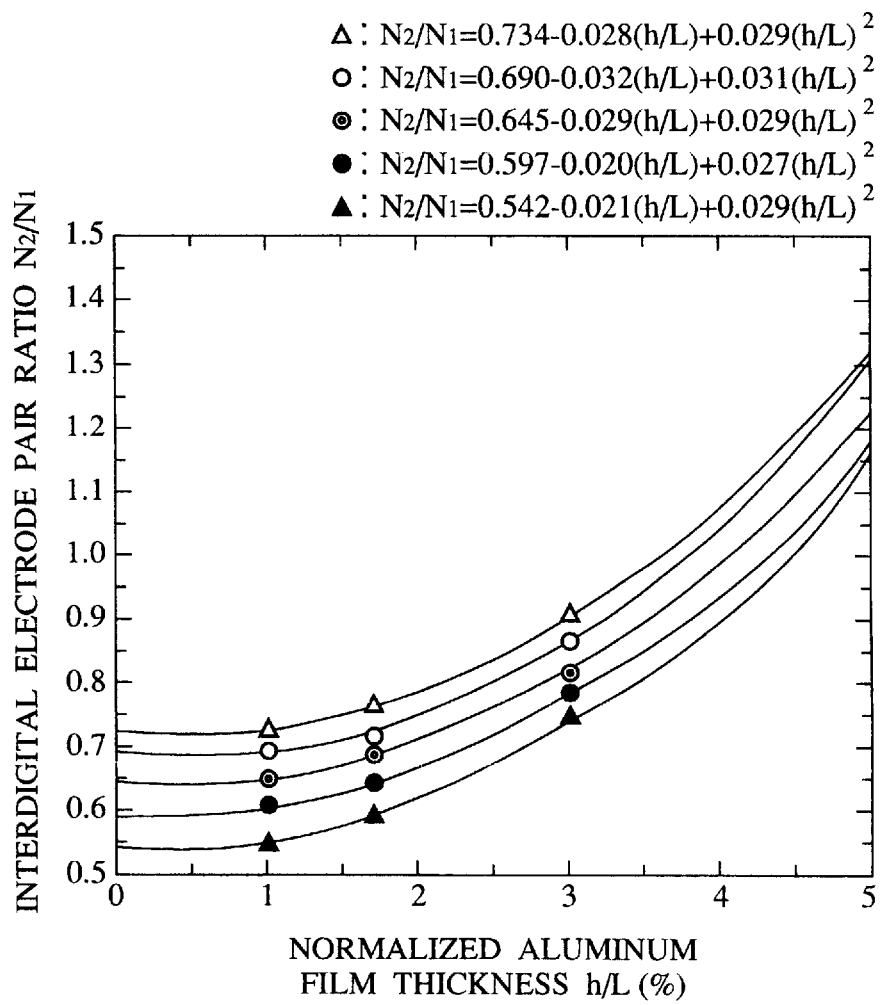
FIG. 7 is a graph showing a range of suitable pair number ratio N2/N1 of the interdigital electrodes changes for suppression of spurious in the lower frequency side of a passband in the surface acoustic wave device according to the embodiment of the present invention with a normalized aluminium film thickness varied.

The above-described results will be summarized in FIG. 7.

Optimum values of the interdigital electrode pair ratio N2/N1 which can most effectively suppress the spurious signals on the lower frequency side are indicated by ⊙; an upper limit of the pair number ratio N2/N1 of the interdigital electrodes which can suppress the spurious signals on the lower frequency side to above 40 dB is indicated by ○; a lower limit thereof is indicated by ●an upper limit of the pair number ratio N2/N1 of the interdigital electrodes which can suppress the spurious signals on the lower frequency side to 30 dB is indicated by Δ; and a lower limit thereof is indicated by ▲.

To suppress the spurious signals on the lower frequency side to above 30 dB, a pair number ratio N2/N1 of the interdigital electrodes is set within a range expressed by the following formula $$0.542-0.021(h/L)+0.029(h/L)^2 \leq N2/N1 \leq 0.734-0.028(h/L)+0.029(h/L)^2.$$

To further suppress the spurious signals on the lower frequency side to above 40 dB, a pair number ratio N2/N1 of the interdigital electrodes is set within a range expressed by the following formula $$0.597-0.020(h/L)+0.027(h/L)^2 \leq N2/N1 \leq 0.690-0.032(h/L)+0.031(h/L)^2.$$

To most effectively suppress the spurious signals on the lower frequency side, a pair number ratio N2/N1 of the interdigital electrodes (⊙) is set so as to satisfy the following formula $$N2/N1=0.645-0.029(h/L)+0.029(h/L)^2.$$

Next, a second matter, suppression of effect of the transverse mode will be discussed. The suppression is conducted by aperture length reduction of the surface acoustic wave device.

In the electrode structure shown in FIG. 1 a pitch of the reflectors 13, 14, 23, 24 is L; a pitch of the interdigital electrodes of the input/output IDTs 11, 21 and the connection IDTs 12, 22 is 0.9836 L; a distance between the interdigital electrodes is 0.4918 L; and a distance between the input/output IDTs 11, 21 and the connection IDTs 12, 22, and the reflectors 13, 14, 23, 24 is 0.4959 L. A normalized aluminium film thickness h/L of the electrodes is 1.7%, and an aperture length W is 7 L.

A complex conjugate image impedance and a propagation wave number is given when pair numbers N1 of the input/output IDTs 11, 21 are changed with an interdigital electrode pair ratio N2/N1 between a pair number N1 of the input/output IDTs 11, 21 and a pair number N2 of the connection IDTs 12, 22 set in a range of 0.660–0.690. The interdigital electrode pair ratio N2/N1 is in a set range because an interdigital electrode pair number has only a discrete value with a 0.5 pair as a minimum unit.

Figure 8:
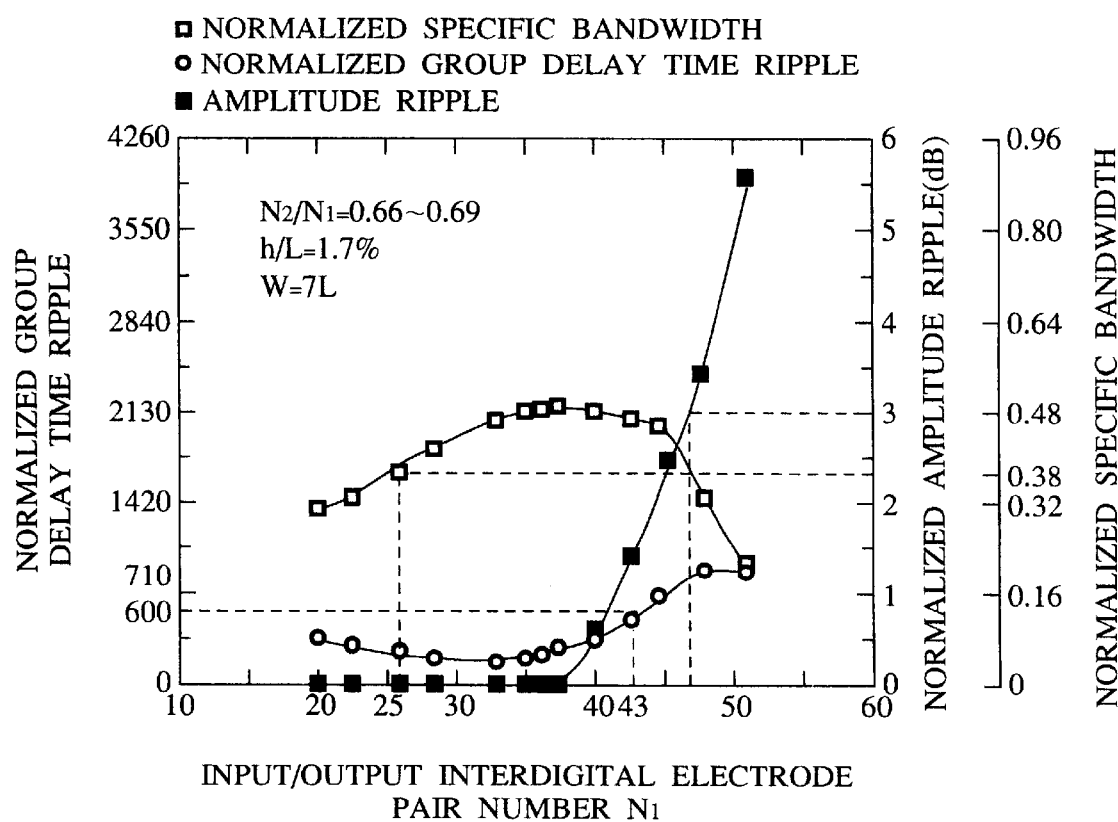
FIG. 8 is a graph of normalized specific bandwidth changes, normalized group delay time ripple changes, and amplitude ripple changes with an input/output IDT pair number N1 varied in the surface acoustic wave device according to the embodiment of the present invention.

A passband width is defined based on this propagation wave number, and frequency response is obtained when surface acoustic wave devices terminate with a complex conjugate image impedance at a center frequency in a passband is given. FIG. 8 shows normalized specific bandwidths (□), normalized group delay time ripples (○), and amplitude ripples (■) for this frequency response.

Here, the normalized specific bandwidth (□) is a normalized specific bandwidth value given by dividing a specific bandwidth by an electromechanical coupling factor of substrates. The normalized group delay time ripple (○) is a group delay time ripple value, i.e., a value of a normalized group delay time ripple given by multiplying a difference between a maximum group delay time and a minimum group delay time in a passband by a center frequency of the frequency response. The amplitude ripple (■) is a value of a difference between a maximum insertion loss and a minimum insertion loss in the passband.

The normalized specific bandwidth is used as the specific bandwidth for the following reason. It is known that the specific bandwidth of a surface acoustic wave resonator filter is proportional to the electromechanical coupling factor of a used piezoelectric substrate. The normalized specific bandwidth is a value given by dividing a specific bandwidth by an electromechanical factor of the substrate so that judgement standards do not depend on a kind of the used piezoelectric substrate.

The normalized group delay time ripple is used as group delay time ripple for the following reason. A group delay time, which is in inverse proportion to a center frequency, changes with different center frequencies. Then, to generalize the judgement reference, normalized group delay time ripple given by multiplying group delay time ripple by a center frequency is used.

As apparent in FIG. 8, a maximum normalized specific bandwidth is obtained at a pair number N1 of 37.5 pairs of the input/output IDTs 11, 21, and a pair number N2 of 25.5 pairs of the connection IDTs 12, 22. An amplitude ripple is zero when a pair number N2 of the input/output IDTs 11, 21 is small, and increases when a pair number N1 is above 39.5 pairs. A minimum normalized group delay time ripple is obtained when a pair number N1 of the input/output IDTs 11, 21 is 33.5 pairs, and increases when a pair number N1 is below 33.5 pairs. When a pair number N1 is above 43 pairs, the normalized group delay time ripple exceeds 600.

It has been found that when a reference for limiting an optimum range of the interdigital electrode pair numbers is above a 0.38 normalized specific bandwidth, below a 600 normalized group delay time ripple and below a 3 dB amplitude ripple, for a 1.7% normalized aluminium film thickness, good filter characteristics can be obtained when a pair number N1 of the input/output IDTS 11, 21 is within a range of 25 to 43 pairs.

Figure 9:
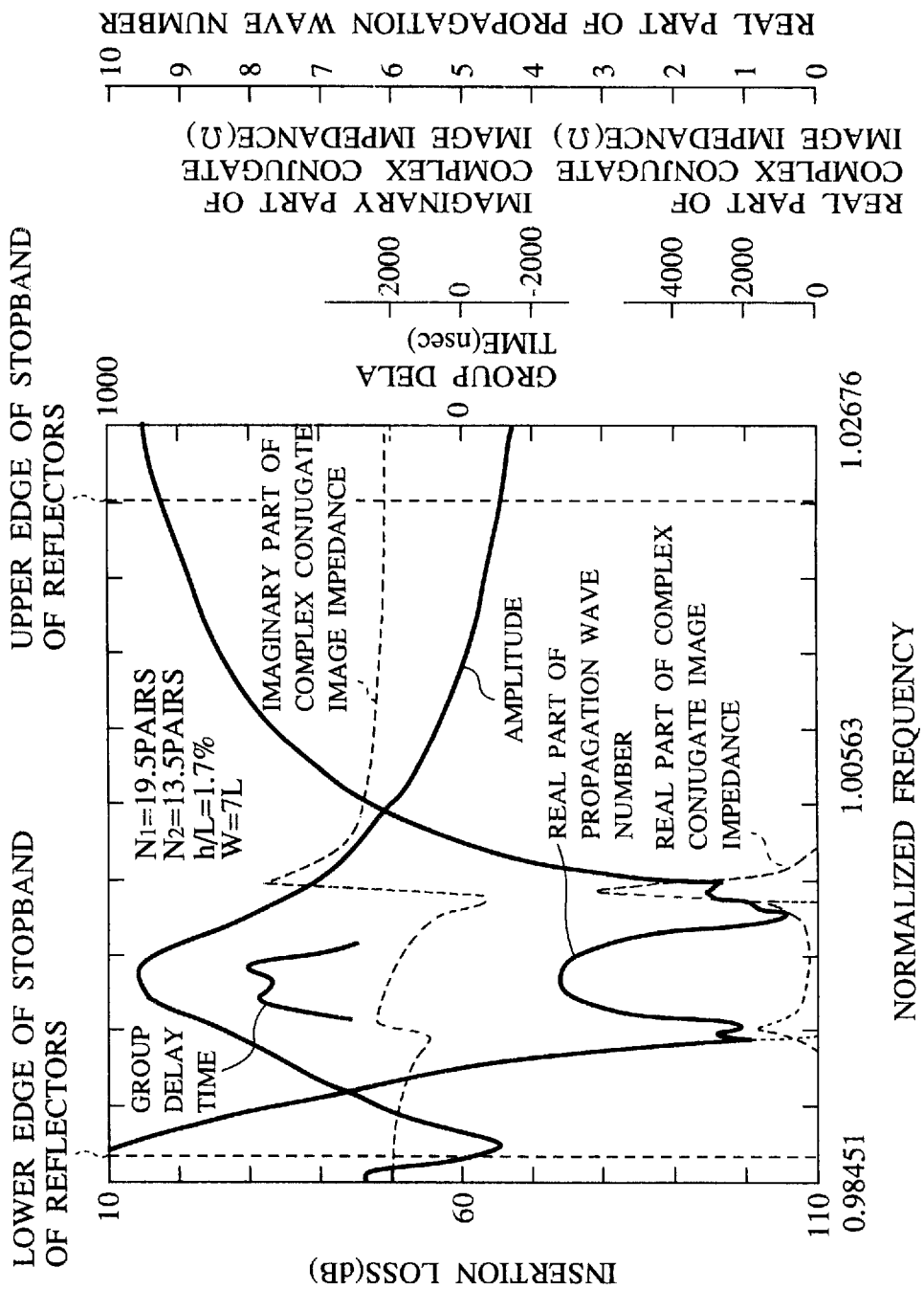
FIG. 9 is a graph of frequency response of real part of propagation wave number, complex conjugate image impedance and group delay time obtained when a pair number of interdigital electrodes is smaller than an optimum pair number of interdigital electrodes (pair number N1 of input/output IDT is 19.5, and pair number N2 connection IDT is 13.5) in the surface acoustic wave device according to the embodiment of the present invention.
Figure 10:
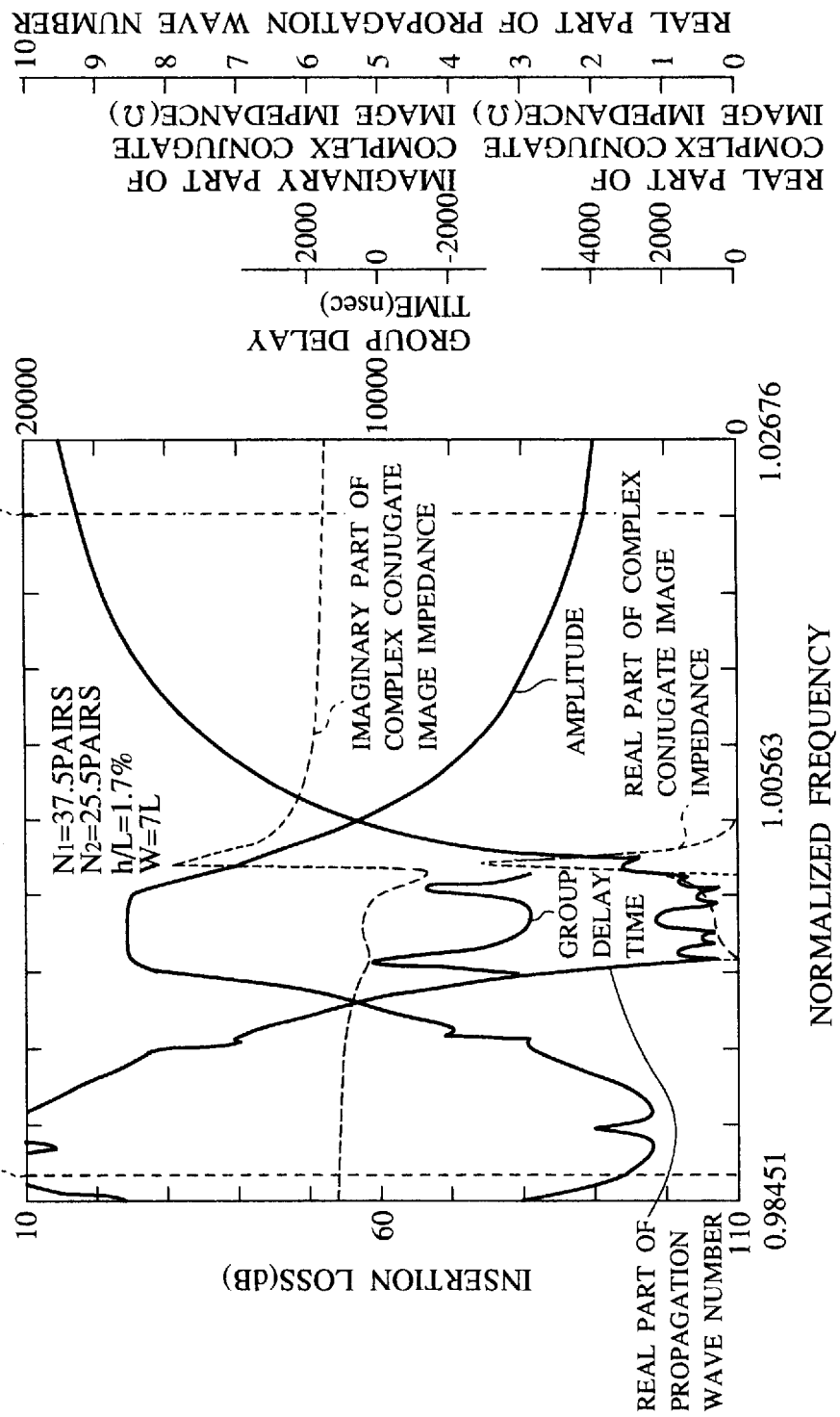
FIG. 10 is a graph of frequency response of real part of propagation wave number, complex conjugate image impedance and group delay time obtained when a pair number of interdigital electrodes is within the range of an optimum pair number of interdigital electrodes (pair number N1 of input/output IDT is 37.5, and pair number N2 of connection IDT is 25.5) in the surface acoustic wave device according to the embodiment of the present invention.
Figure 11:
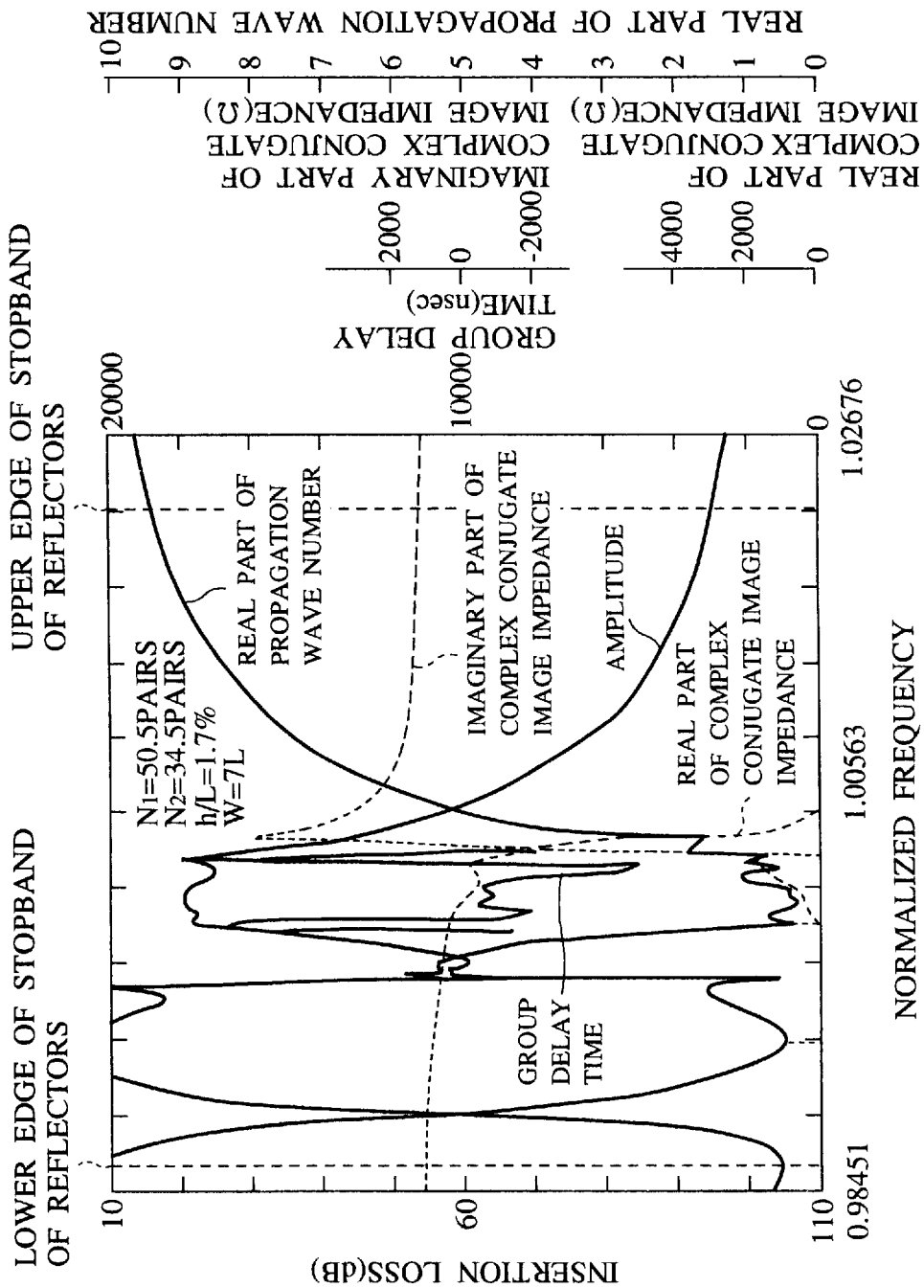
FIG. 11 is a graph of frequency response of real part of propagation wave number, complex conjugate image impedance and group delay time obtained when a pair number of interdigital electrodes is larger than an optimum pair number of interdigital electrodes (pair number N1 of input/output IDT is 50.5, and pair number N2 of connection IDT is 34.5) in the surface acoustic wave device according to the embodiment of the present invention.

FIGS. 9 to 11 show frequency response of real parts of a propagation wave number, complex conjugate image impedances, group delay times and an amplitude when the input/output IDTs 11, 21, and the connection IDTs 12, 22 take various pair numbers N1, N2. A normalized aluminium film thickness is 1.7%.

FIG. 9 shows frequency response of real parts of a propagation wave number, complex conjugate impedances, group delay times and an amplitude obtained when a pair number N1 of the input/output IDTs 11, 21 is smaller than the above-described range, and a pair number N2 of the connection IDTs 12, 22 is 13.5 pairs.

As apparent in FIG. 9, the passband width which is defined as the real parts of the propagation wave number is wide, but the conjugate image impedances greatly vary in the passband. Then, when the surface acoustic wave filter is matched at a complex conjugate image impedance value of 215+j1902 Ω at the center frequency of the passband, and is terminated at the 50 Ω system, the filter can be matched at the frequency. However, because complex conjugate image impedances greatly vary at the frequencies on both outsides thereof, the matching cannot be made, and the frequency responses is of single peak and narrow bandwidth. The amplitude ripple is zero, and the group delay time ripple is relatively low.

FIG. 10 shows frequency response of real parts of the propagation wave number, complex conjugate impedances, group delay times and an amplitude obtained when a pair number N1 of the input/output IDTs 11, 21 is 37.5 pairs, which is within the above-described range, and a pair number N2 of the connection IDTs 12, 22 is 25.5 pairs.

As apparent in FIG. 10, the real parts of the propagation wave number provides a relatively wide bandwidth, and the complex conjugate image impedances in this frequency range are flat, and especially the imaginary parts of the complex conjugate image impedances are flat. When the surface acoustic wave filter is matched at a complex conjugate image impedance of 759+j580 Ω at the center frequency of the passband and is terminated at the 50 Ω system, the frequency response has flat amplitude and little group delay time ripple.

FIG. 11 shows frequency response of real parts of a propagation wave number, complex conjugate impedances and group delay times obtained when a pair number N1 of the input/output IDTs 11, 21 is 50.5 pairs, which is larger than the above-described range, and a pair number N2 of the connection IDTs 12, 22 is 34.5 pairs.

As apparent in FIG. 11, the real parts of the propagation wave number provides a narrow bandwidth, and the complex conjugate image impedances within this frequency range greatly vary. When the surface acoustic wave filter is matched at a complex conjugate image impedance of 464-j127 Ω at the center frequency of the passband, and is terminated at the 50 Ω system, the frequency response has a narrow bandwidth, and a large amplitude ripple and group delay time ripple.

To numerize these changes, a square deviation is given for the value of the complex conjugate image impedances within the frequency of the passband against the value of that at the center frequency of the passband. The normalized frequency axis in the passband is divided in n-sections by 0.0001; based on real parts R(fi) and imaginary parts I(fi) of complex conjugate image impedances at respective points fi (i=1, 2, 3, . . . , n), differences between values R(f0) and I(f0) at the centers of the associated sections and are squared, and roots of the n-sums are given; the respective roots are normalized by the values R(f0) and the values I(f0) at the centers of the respective sections and further divided by a division number n. A real part of the result and an imaginary part thereof are summed to be a square deviation of normalized complex conjugate image impedance DCII. Accordingly a square deviation of normalized complex conjugate image impedance DCII is expressed by the following formula $$DCII = \left\{ \sum_{i=1}^{n} (R(fi) - R(f0))^2 \right\}^{1/2} /(nR(f0)) +$$

-continued $$\left\{ \sum_{i=1}^{n} (I(fi) - I(f0))^2 \right\}^{1/2} \quad (nI(f0))$$

Figure 12:
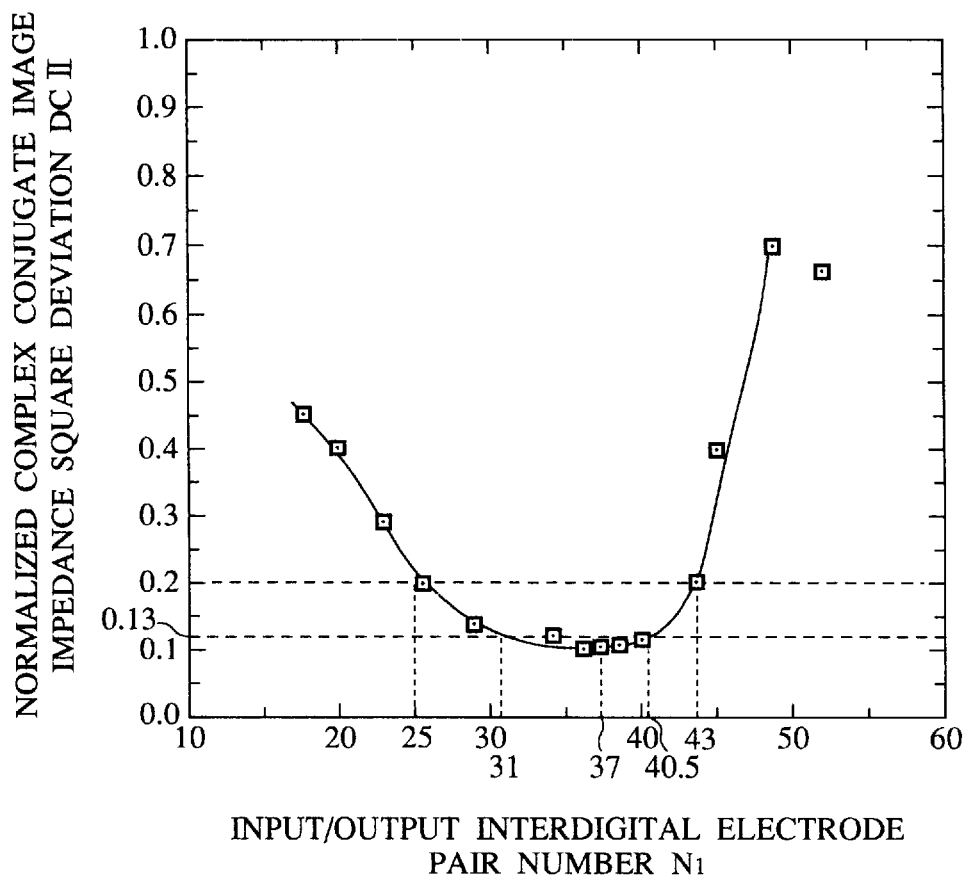
FIG. 12 is a graph showing dependence of square deviation of complex conjugate image impedance DCII on pair number N1 of input/output interdigital electrode in the surface acoustic wave device according to the embodiment of the present invention.

FIG. 12 shows dependence of the square deviation of normalized complex conjugate image impedance DCII on the input/output interdigital electrode pair number N1. Here an interdigital electrode pair ratio N2/N1 is 0.660–0.690.

As apparent in FIG. 12, a square impedance of normalized complex conjugate image impedance DCII is below 0.2 in a range of 25 to 43 input/output interdigital electrode pairs N1, and good filter characteristics of low amplitude ripple and group delay time ripple in a relatively wide passband can be obtained. In a range of 31 to 40.5 input/output interdigital electrode pairs a square deviation of normalized complex conjugate image impedance DCII is below 0.13, and better filter characteristics of low amplitude ripple and group delay time ripple in a wider passband can be obtained. When an input/output interdigital electrode pair N1 is 37 pairs, a square deviation of normalized complex conjugate image impedance DCII is minimum, and the best filter characteristics of little amplitude ripple and group delay time ripple in a wide passband can be obtained.

The above-described detailed discussion is on the surface acoustic wave device for the normalized aluminium film of a 1.7% thickness, and the same discussion is made on the surface acoustic wave device for the normalized aluminium film of a 1% thickness and a 3% thickness.

When a normalized aluminium film thickness is 1%, in a range of 32–50 input/output interdigital electrode pair number N1, a square deviation of normalized complex conjugate image impedance DCII is below 0.2, and good filter characteristics of little amplitude ripple and group delay time ripple in a wide band can be obtained. In a range of 39–48 input/output interdigital electrode pair number N1, a square deviation of normalized complex conjugate image impedance DCII is below 0.13 and better filter characteristics of little amplitude ripple and group delay time ripple in a wider band can be obtained. When an input/output interdigital electrode pair number N1 is 45, a square deviation of normalized complex conjugate image impedance DCII is minimum, and the best filter characteristics of little amplitude ripple and group delay time ripple in a relatively wide passband can be obtained.

In the case that the normalized aluminium film thickness is 3%, in a range of 10–28 input/output interdigital electrode pair number N1, a square deviation of normalized complex conjugate image impedance DCII is below 0.2, and good filter characteristics of little amplitude ripple and group delay time ripple in a relatively wide passband. In a range of 17–26 input/output interdigital electrode pair number N1, a square deviation of normalized complex conjugate image impedance DCII is below 0.13, and better filter characteristics of little amplitude ripple and group delay time ripple in a wider band can be obtained. When an input/output interdigital electrode pair number N1 is 23, a square deviation of normalized complex conjugate image impedance DCII is minimum, and the best filter characteristics of little amplitude ripple and group delay time ripple in a relatively wide passband can be obtained.

Figure 13:
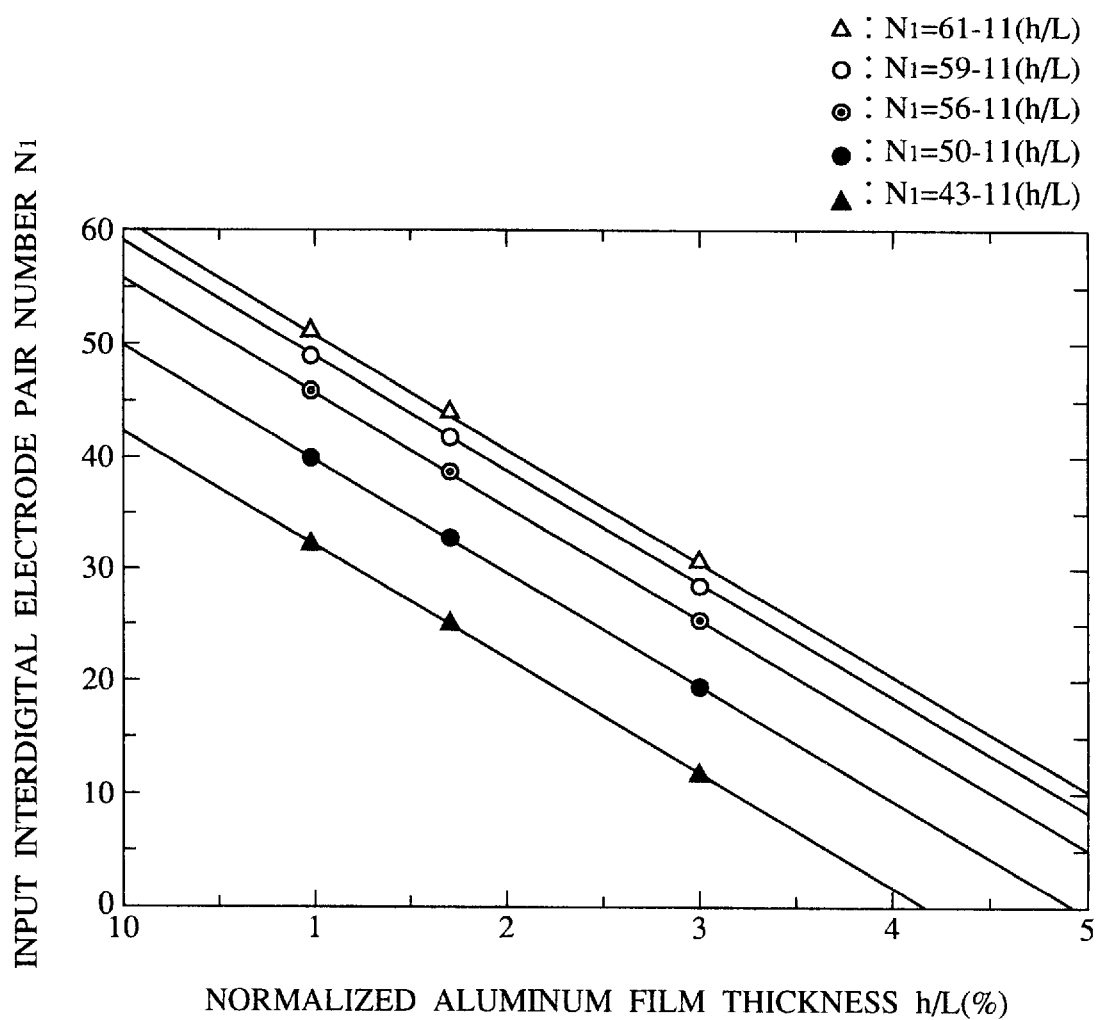
FIG. 13 is a graph of changes of pair number N1 of input/output interdigital electrodes ranges suitable to effectively suppress the influence of transverse mode influence and to obtain good frequency characteristics when a normalized aluminium film thickness is changed in the surface acoustic wave device according to the embodiment of the present invention.

The above-described results are shown together in FIG. 13.

An optimum value of the input/output interdigital electrode pair number N1 which makes a square deviation of normalized complex conjugate image impedance DCII minimum is indicated by ⊙. An upper limit of the input/output interdigital electrode pair number N1 which makes a square deviation of normalized complex conjugate image impedance DCII below 0.13 is indicated by ○, and a lower limit therefore is indicated by ●. An upper limit of the input/output interdigital electrodes pair number N1 which makes a square deviation of normalized complex conjugate image impedance DCII below 0.20 is indicated by △, and a lower limit therefor is indicated by ▲.

To make a square deviation of normalized complex conjugate image impedance DCII below 0.20 for better frequency characteristics, an input/output interdigital electrode pair number N1 is set in a range of the following formula $$43-11(h/L) \leq N1 \leq 61-11(h/L).$$

To make a square deviation of normalized complex conjugate image impedance DCII below 0.13 for better frequency characteristics, an input/output interdigital electrode pair number N1 is set in a range of the following formula $$50-11(h/L) \leq N1 \leq 59-11(h/L).$$

To make a square deviation of normalized complex conjugate image impedance DCII minimum for the best frequency characteristics, an input/output interdigital electrode pair number N1 is set so as to satisfy the following formula $$N1=56-11(h/L).$$

As shown in FIG. 1, the electrode constitution of the surface acoustic wave device according to the present invention is electrically symmetrical with respect to the cascade-connected plane, and can be seen as the electrically symmetric lattice-type circuit with respect to the cascade-connected plane.

When a pair number N1 of the input/output IDTs 11, 21 is 37.5, a pair number N2 of the connection IDTs 12, 22 is 25.5, an aperture length W is 7 L, and a normalized aluminium film thickness h/L is 1.7%, a pitch of the reflectors 13, 14, 23, 24 is L, a pitch of the interdigital electrodes of the input/output IDTs 11, 21 and the connection IDTs 12, 22 is 0.9836 L, and a distance between the input/output IDTs 11, 21 and the connection IDTs 12, 22 is 0.4918 L. A distance between the input/output IDTs 11, 21 and the connection IDTs 12, 22, and the reflectors 13, 14, 23, 24 is 0.4959 L.

Figure 2:
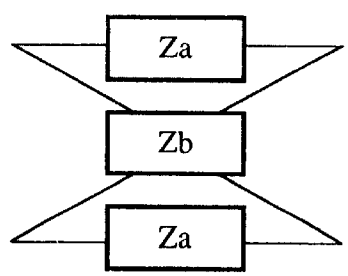
FIG. 2 is a view of a symmetric lattice-type circuit which is electrically equivalent to the surface acoustic wave device according to the embodiment of the present invention.
Figure 14:
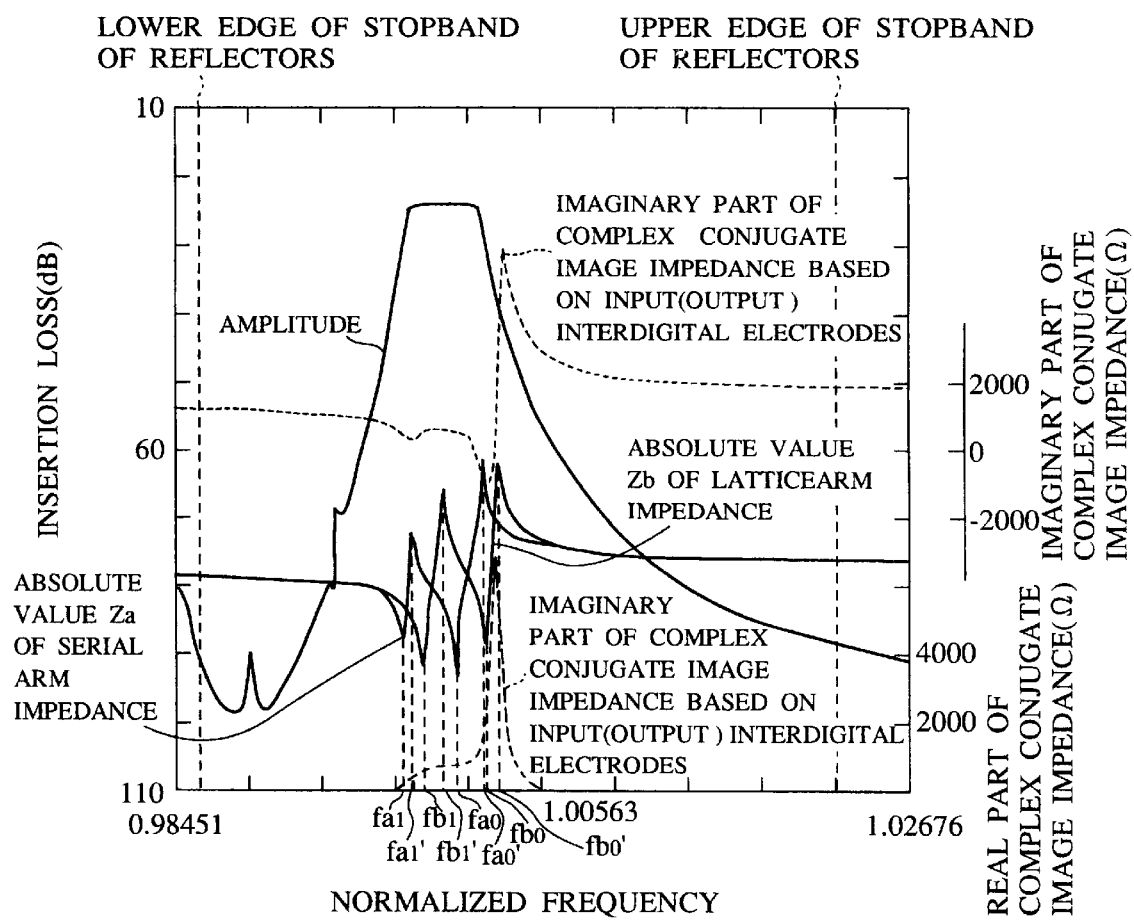
FIG. 14 is a graph showing frequency characteristics, frequency response and complex conjugate image impedance of lattice arm impedance Zb and serial arm impedance Za of the symmetric lattice-type circuit.

FIG. 14 shows frequency characteristics of the lattice arm impedance Zb and the serial arm impedance Za of the symmetrical lattice-type circuit shown in FIG. 2 which is electrically equivalent to the surface acoustic wave device. Frequency response was measured by using the matching circuit with 759+j580 Ω and terminating those at 50 Ω.

In the lattice arm impedance Zb and the serial arm impedance Za a set of resonance and antiresonance on the high frequency side is called 0-th mode, and a set of resonance and antiresonance on the lower frequency side is called first mode. In resonance and antiresonance frequency positions of the lattice arm impedance Zb and the serial arm impedance Za of the symmetric lattice-type circuit, the resonance frequency (fb1) of the symmetric first mode of the lattice arm impedance Zb and the antiresonance frequency (fa1') of the antisymmetric first mode are a little offset from each other, and the antiresonance frequency (fb1') of the symmetric first mode of the lattice arm impedance Zb and the resonance frequency (fa0) of the antisymmetric 0-th mode of the serial arm impedance Za are not in agreement with each other. The resonance frequency (fb0) of the symmetric 0-th mode of the lattice arm impedance Zb and the antiresonance frequency (fa0') of the antisymmetric 0-th mode of the serial arm impedance Za are substantially in agreement with each other. The resonance frequency (fa1') of the antisymmetric first mode of the serial arm impedance and the antiresonance frequency (fb0') of the symmetric 0-th mode of the lattice arm impedance Zb are not in agreement with the other resonance frequencies or antiresonance frequencies.

Then, modes necessary to form a passband will be discussed.

A bandwidth has been already defined by an intersection between an envelope of real parts of propagation wave number of complex conjugate image impedance, and a normalized frequency axis on which real parts of propagation wave number are zero.

According to this definition, modes present in a passband are the resonance frequency (fa0) of the antisymmetric 0-th mode and the antiresonance frequency (fa1') of the antiresonance first mode of the serial arm impedance Za, and the antiresonance frequency (fb1') of the symmetric first mode and resonance frequency (fb1) of the symmetric first mode of the lattice arm impedance Zb.

On the other hand, the resonance frequency (fb0) of the lattice arm impedance Zb, and the resonance frequency (fa1) of the antisymmetric first mode and the antiresonance frequency (fa0') of the antisymmetric 0-th mode of the serial arm impedance Za are located a little outward in the passband, but they contribute to flatten the complex conjugate image impedance. From this viewpoint it can be said that these three modes are necessary to form a passband.

Figure 20:
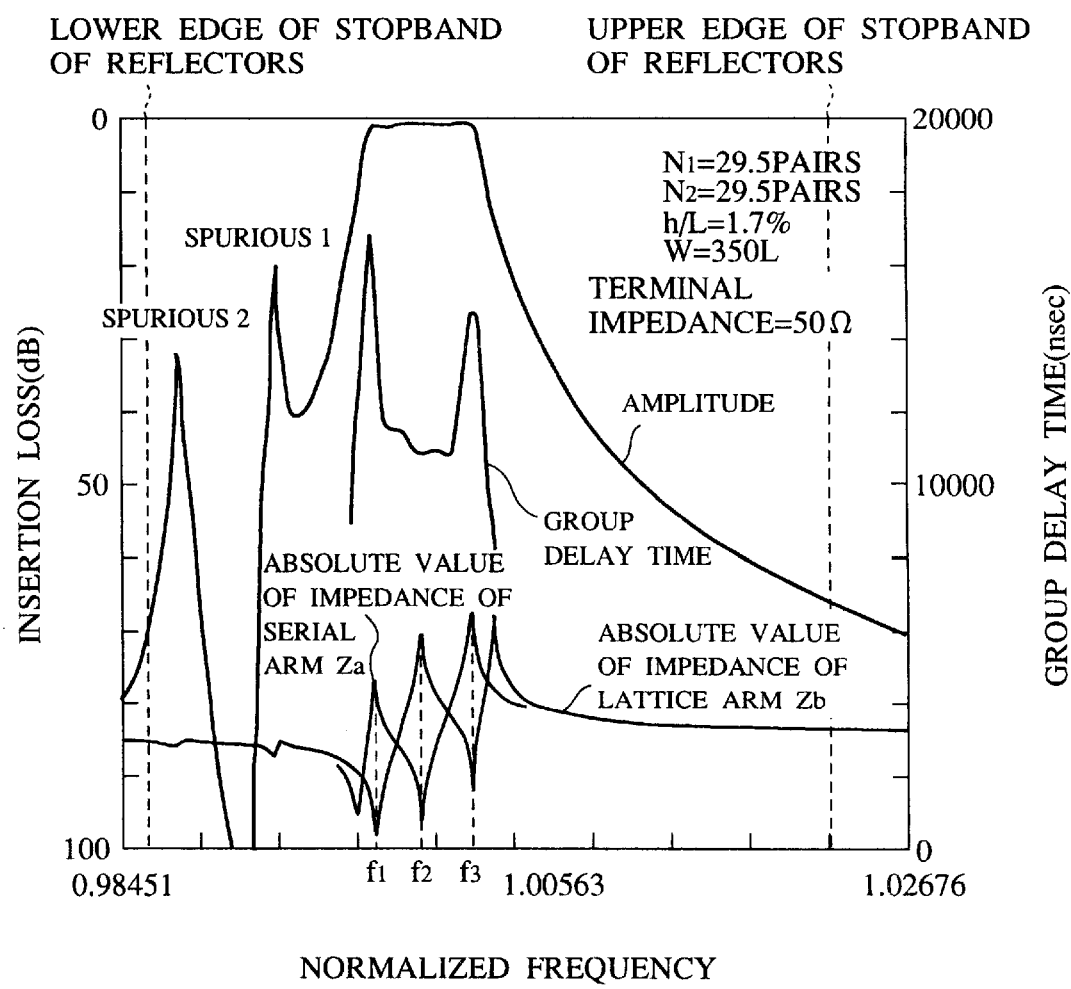
FIG. 20 is a graph of frequency responses, lattice arm impedance Zb and serial arm impedance Za of Control 2.

For Control 2, frequency response of a lattice arm impedance Zb and a serial arm impedance Za of a symmetric lattice-type circuit which is electrically equivalent to the surface acoustic wave device according to Control 2 is shown in FIG. 20.

Two resonances and two antiresonances are present respectively in the serial arm impedance Za and the lattice arm impedance Zb. In each impedance, a set of the resonance and the antiresonance on the higher frequency side is called 0-th mode, and a set of the resonance and the antiresonance on the lower frequency side is called first mode. The resonance frequency of the symmetric first mode of the lattice arm impedance Zb and the antiresonance frequency of the antisymmetric first mode of the serial arm impedance are substantially in agreement with each other (f1), the antiresonance frequency of the symmetric first mode of the lattice arm impedance Zb and the resonance frequency of the antisymmetric 0-th mode of the serial arm impedance Za are substantially in agreement with each other (f2), the resonance frequency of the symmetric 0-th mode of the lattice arm impedance and the antiresonance frequency of the antisymmetric 0-th mode of the serial arm impedance are substantially in agreement with each other (f3), and a difference between the frequency f1 and the frequency f3 is substantially in agreement with the passband width.

The technique of "frequency matching" in the conventional surface acoustic wave device using the symmetric mode and the antisymmetric mode works in cases, as of Control 2. However, according to the present invention, as shown in FIG. 14, the resonance frequency and the antiresonance frequency of the serial arm impedance Za and of the lattice arm impedance Zb are not in perfect agreement with each other. It is because the complex conjugate image impedance is flat that flat amplitude ripple and group delay time ripple can be obtained even under such conditions.

The present invention is not limited to the above-described embodiment.

For example, in the above-described embodiment, a distance Li between the interdigital electrodes is 0.4918 L, and a distance Lir between the interdigital electrodes and the reflectors is 0.4959 L, but they are not limited to these values.

In the above-described embodiment, an aperture length is 7 L, but with aperture lengths of 5 L to 12 L, the same effect can be attained.

As well as in the above-described embodiment, even with larger aperture lengths of 50 L to 350 L, when a terminating impedance is terminated at a real number of 20–130 Ω, ripples in a passband due to the transverse mode is observed, and the surface acoustic wave device has larger sizes, but good frequency response (the effect of suppressing spurious signals on the lower frequency side) can be obtained.

In the above-described embodiment, two electrode structure rows are connected in cascade, and it is also possible that additional electrode structures are connected in cascade with this two-stage electrode structures to form multi-stage connections, as of 4 stages, 6 stages, 8 stages, etc.

As materials of the interdigital electrodes, copper, silicon, titanium, $HfB_2$, or others may be added to aluminium, and the interdigital electrodes may be formed of other conducting materials.

The interdigital electrodes may be formed by lift-off or may be patterned by etching.

(Example)

Figure 15:
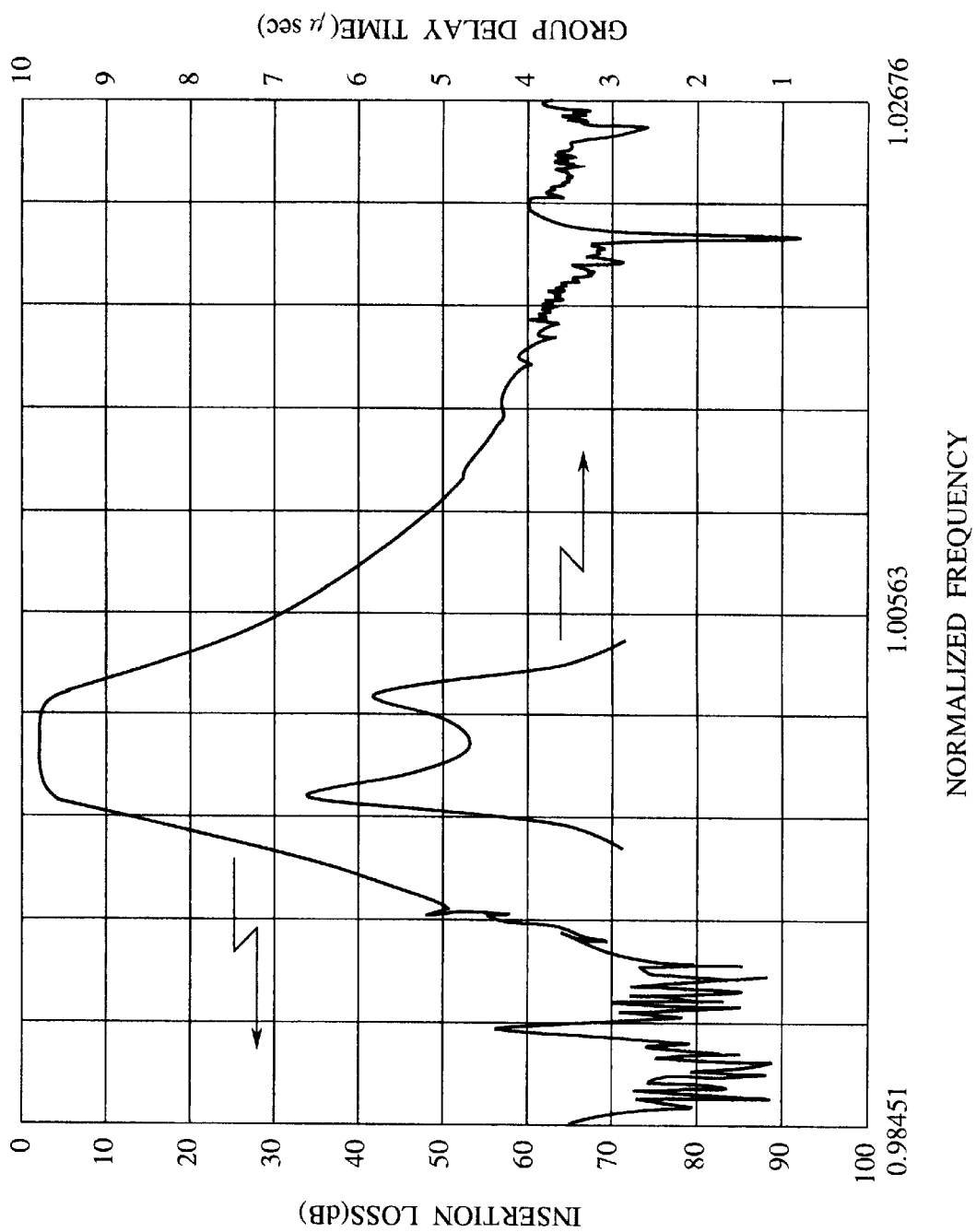
FIG. 15 is a graph of frequency responses of the surface acoustic wave device according to the embodiment of the present invention.
Figure 16:
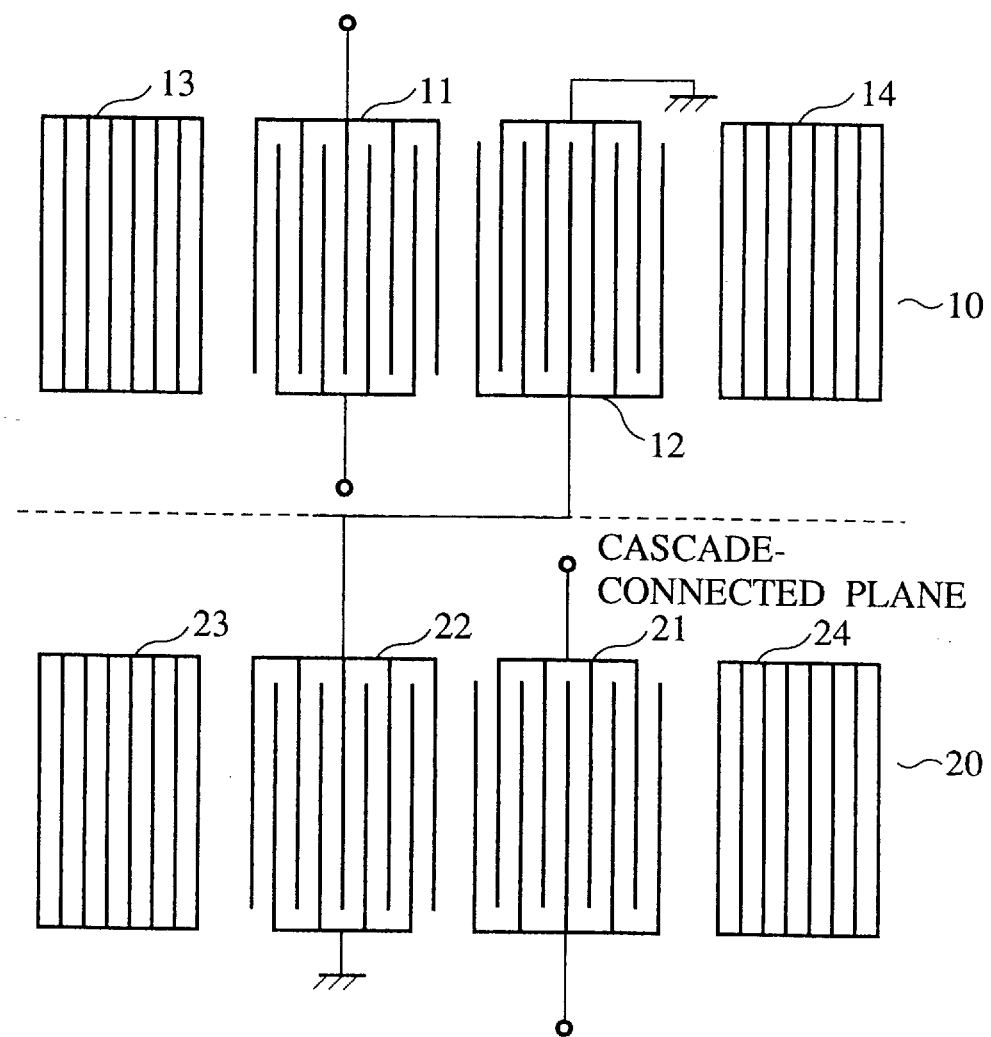
FIG. 16 is a view of the electrode structure of the conventional surface acoustic wave device.
Figure 17:
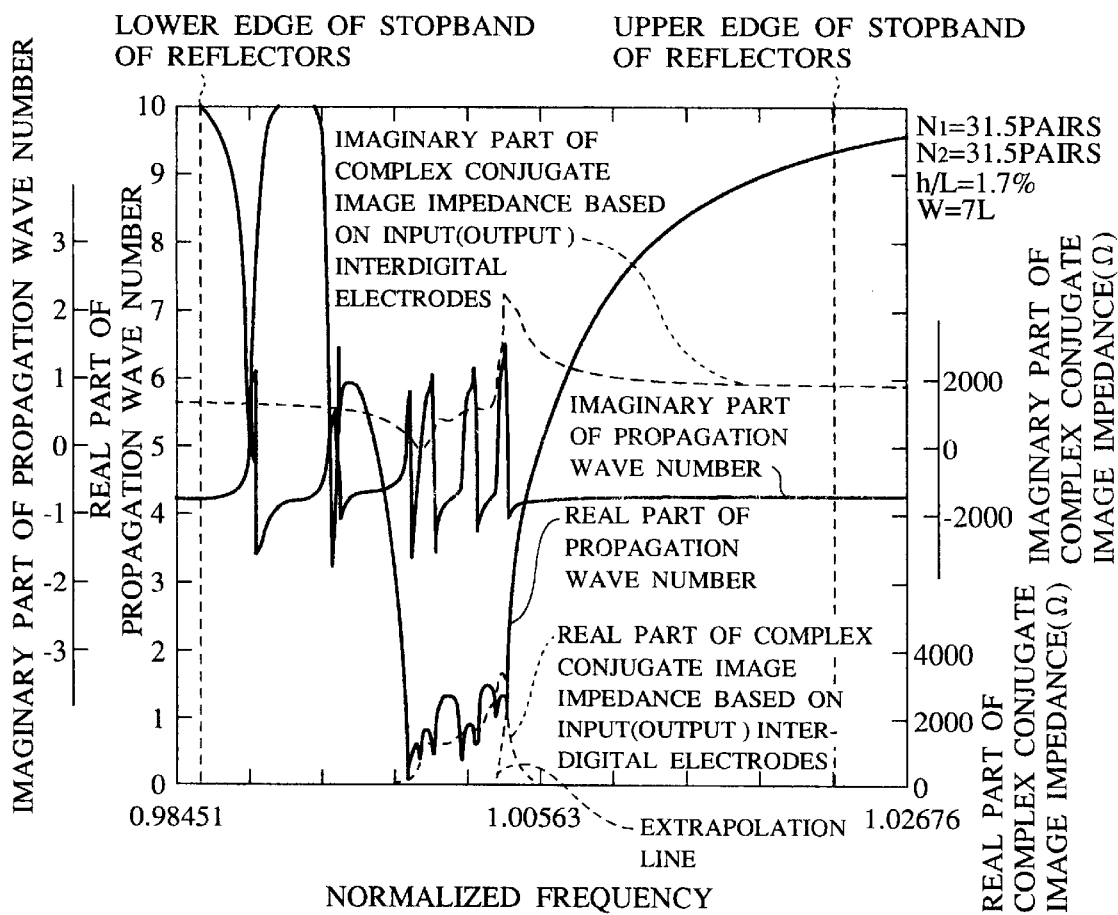
FIG. 17 is a graph showing complex conjugate image impedance and propagation wave number of Control 1.
Figure 18:
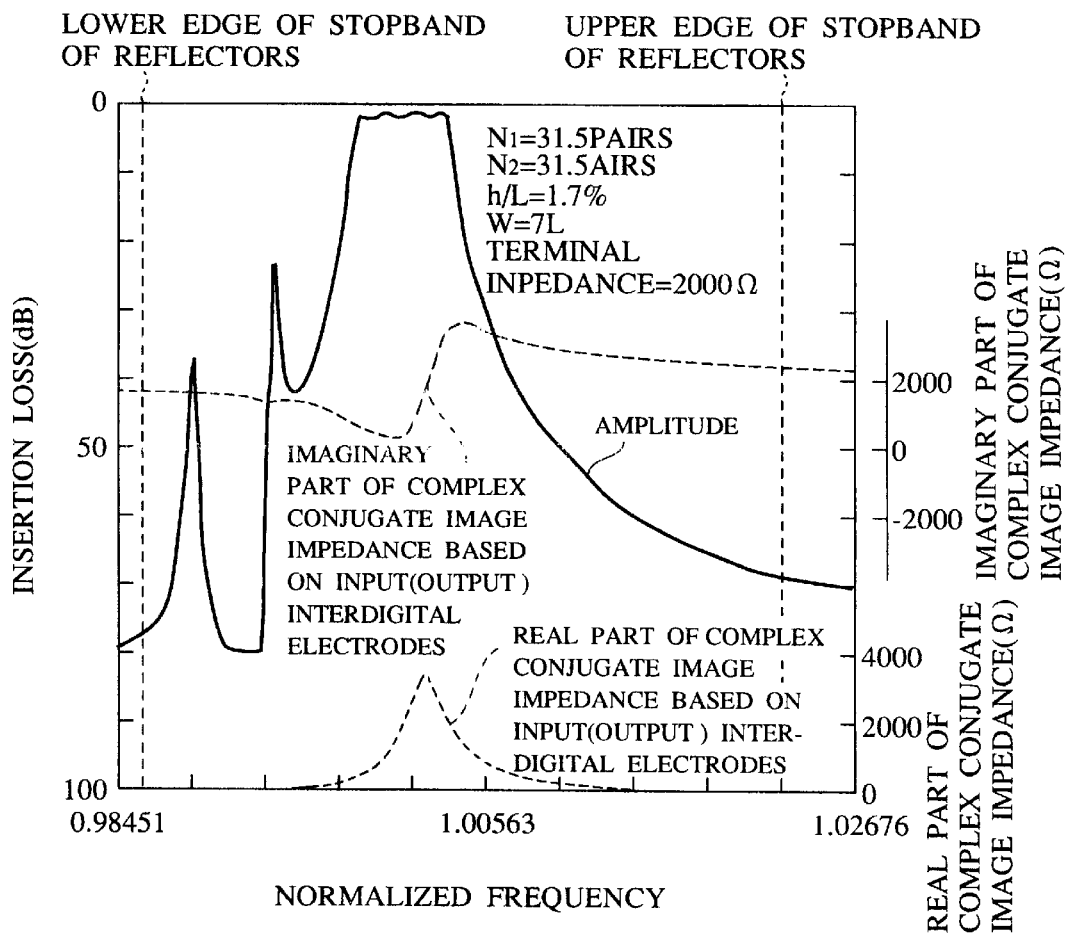
FIG. 18 is a graph of frequency responses and complex conjugate image impedance of one electrode structure row of Control 1.
Figure 19:
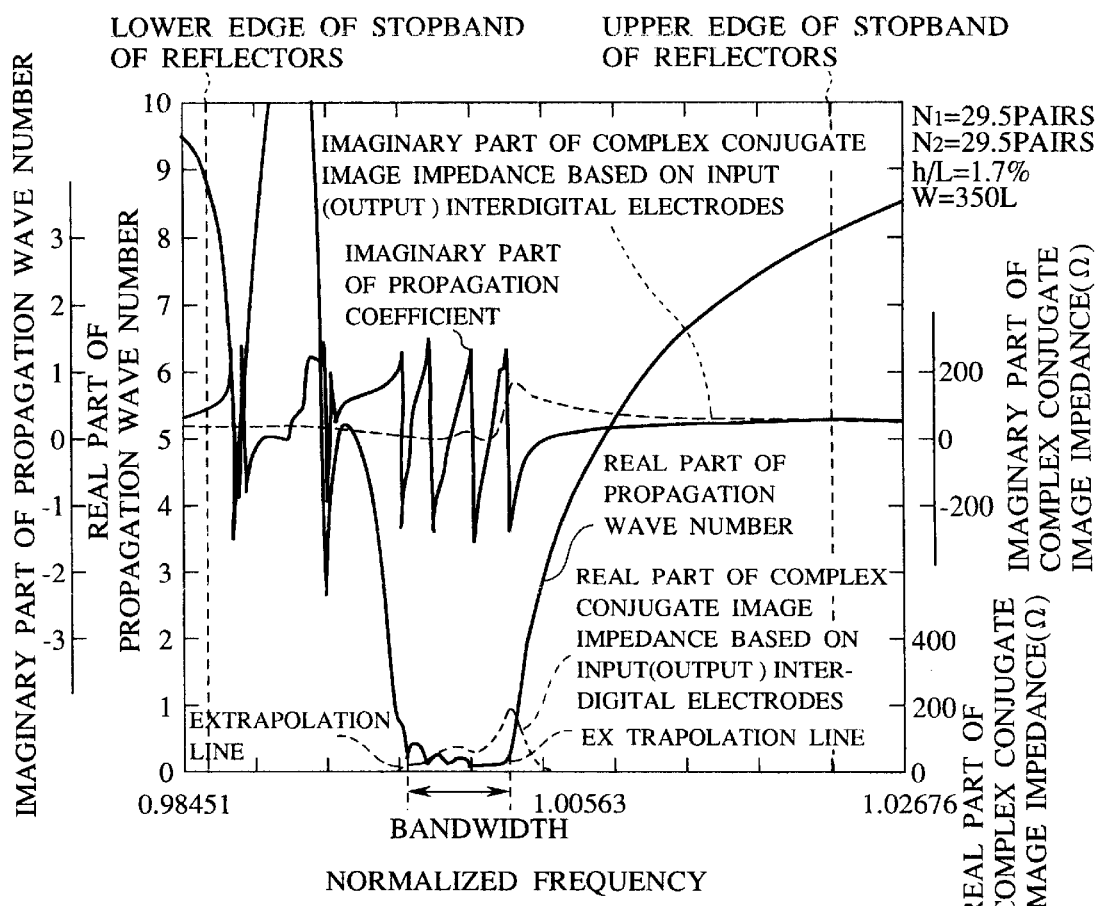
FIG. 19 is a graph of complex conjugate image impedance and propagation wave number of Control 2.

A surface acoustic wave device of the structure shown in FIG. 1 was fabricated and evaluated. FIG. 15 shows the frequency responses of the surface acoustic wave device. As the piezoelectric substrate a 45° rotated X-cut Z-propagation lithium tetraborate single crystal substrate was used, and the propagation direction of surface acoustic waves was Z direction. The interdigital electrodes and the reflectors were patterned by vacuum depositing aluminium metal film on a resist pattern formed by the known photolithography and lifting off the same.

The interdigital electrodes were of the so-called normal type in which the electrode strips are overlapped over substantially equal lengths, and the aperture length was 6.88 L. The pair number N1 of the input/output IDTs 11, 21 was 37.5, the pair number N2 of the connection IDTs 12, 22 were 25.5, and the electrode number of the reflectors 13, 14, 23, 24 was 60. The metallization ratio was 0.5. The pitch of the reflectors 13, 14, 23, 24 was L (=12 μm). The pitch of the interdigital electrodes of the input/output IDTs 11, 21 and that of the interdigital electrodes of the connection IDT 12, 22 were 0.9836 L. The distance between the input/output IDTs 11, 21 and the connection IDT s 12, 22 was 0.4918 L. The distance between the input/output IDTs 11, 21 and the connection IDTs 12, 22, and the reflectors 13, 14, 23, 24 was 0.4959 L.

An L-type matching circuit was constituted by an inductor and a capacitor so that the terminating impedance is 759+j580 Ω based on values of the complex conjugate image impedances at the center frequency of the passband given by real parts of propagation wave number.

As the filter characteristics, the minimum insertion loss was 2 dB, the amplitude ripple was 0.2 dB, the group delay time ripple was 2 μsec, the specific bandwidth was 0.46%, the shape factor (3 dB bandwidth/30 dB bandwidth) was 0.55, and the spurious signal on the lower frequency side in the stop band was above 50 dB. Thus good filter characteristics were obtained.

[INDUSTRIAL APPLICABILITY]

The surface acoustic wave device according to the present invention can realize good filter characteristics of low insertion losses, small amplitude ripples and group delay time ripples, relatively large specific bandwidths, good shape factors, large attenuation, and is useful as filters for use in mobile communications, etc., especially as intermediate frequency filters for use in digital communications.

We claim:

1. A surface acoustic wave device comprising:

a piezoelectric substrate;

a first electrode structure row formed on the piezoelectric substrate, and including N1 pairs of input/output IDT, N2 pairs of a connection IDT disposed near one side of the input/output IDT, and two reflectors disposed outside the input/output IDT and the connection IDT; and a second electrode structure row formed on the piezoelectric substrate, and including N1 pairs of input/output IDT, N2 pairs of a connection IDT disposed near one side of the input/output IDT, and two reflectors disposed outside the input/output IDT and the connection IDT, the second electrode structure row being cascade-connected to the first electrode structure row, the connection IDT of the first electrode structure row, and the connection IDT of the second electrode structure row being arranged electrically symmetric with respect to the cascade-connected plane, when the surface acoustic wave device is represented by an electrically symmetric lattice-type circuit including a lattice arm impedance and a serial arm impedance, the pair number N1 of the input/output IDT being determined so that a passband is formed by using at least one resonance point and at least one antiresonance point of the lattice arm impedance, and at least one resonance point and at least one antiresonance point of the serial arm impedance, the pair number N1 of the input/output IDT being different from the pair number N2 of the connection IDT.

2. A surface acoustic wave device according to claim 1, wherein the pair number N1 of the input/output IDT is determined so that at least two resonance points and at least one antiresonance point of the lattice arm impedance, and at least two resonance points and at least two antiresonance points of the serial arm impedance are used to form the passband.

3. A surface acoustic wave device comprising:

a piezoelectric substrate;

a first electrode structure row formed on the piezoelectric substrate, and including N1 pairs of input/output IDT, N2 pairs of a connection IDT disposed near one side of the input/output IDT, and two reflectors disposed outside the input/output IDT and the connection IDT; and a second electrode structure row formed on the piezoelectric substrate, and including N1 pairs of input/output IDT, N2 pairs of a connection IDT disposed near one side of the input/output IDT, and two reflectors disposed outside the input/output IDT and the connection IDT, the second electrode structure row being cascade-connected to the first electrode structure row, the connection IDT of the first electrode structure row, and the connection IDT of the second electrode structure row being arranged electrically symmetric with respect to the cascade-connected plane, the pair number N1 of the input/output IDT being different from the pair number N2 of the connection IDT, when a normalized electrode film thickness of the input/output IDT and the connection IDT is represented by h/L, the pair number N1 of the input/output IDT satisfying the following formula $$43-11(h/L) \leq N1 \leq 61-11(h/L).$$

4. A surface acoustic wave device according to claim 3, wherein the pair number N1 of the input/output IDT satisfies the following formula $$50-11(h/L) \leq N1 \leq 59-11(h/L).$$

5. A surface acoustic wave device comprising:

a piezoelectric substrate;

a first electrode structure row formed on the piezoelectric substrate, and including N1 pairs of input/output IDT, N2 pairs of a connection IDT disposed near one side of the input/output IDT, and two reflectors disposed outside the input/output IDT and the connection IDT; and a second electrode structure row formed on the piezoelectric substrate, and including N1 pairs of input/output IDT, N2 pairs of a connection IDT disposed near one side of the input/output IDT, and two reflectors disposed outside the input/output IDT and the connection IDT, the second electrode structure row being cascade-connected to the first electrode structure row, the connection IDT of the first electrode structure row, and the connection IDT of the second electrode structure row being arranged electrically symmetric with respect to the cascade-connected plane, the pair number N1 of the input/output IDT being different from the pair number N2 of the connection IDT, when a normalized electrode film thickness of the input/output IDT and the connection IDT is represented by h/L, a ratio N2/N1 between the pair number N2 of the connection IDT and the pair number N1 of the input/output IDT satisfying the following formula $$0.542-0.021(h/L)+0.029(h/L)^2 \leq N2/N1 \leq 0.734-0.028(h/L)+0.029(h/L)^2.$$

6. A surface acoustic wave device according to claim 5, wherein a ratio N2/N1 of the pair number N2 of the connection IDT and the pair number N1 of the input/output IDT satisfying the following formula $$0.597-0.020(h/L)+0.027(h/L)^2 \leq N2/N1 \leq 0.690-0.032(h/L)+0.031(h/L)^2.$$

7. A surface acoustic wave device comprising:

a piezoelectric substrate;

a first electrode structure row formed on the piezoelectric substrate, and including N1 pairs of input/output IDT, N2 pairs of a connection IDT disposed near one side of the input/output IDT, and two reflectors disposed outside the input/output IDT and the connection IDT; and a second electrode structure row formed on the piezoelectric substrate, and including N1 pairs of input/output IDT, N2 pairs of a connection IDT disposed near one side of the input/output IDT, and two reflectors disposed outside the input/output IDT and the connection IDT, the second electrode structure row being cascade-connected to the first electrode structure row, the connection IDT of the first electrode structure row, and the connection IDT of the second electrode structure row being arranged electrically symmetric with respect to the cascade-connected plane, the pair number N1 of the input/output IDT being different from the pair number N2 of the connection IDT, when a normalized electrode film thickness of the input/output IDT and the connection IDT is represented by h/L, a ratio N2/N1 between the pair number N2 of the connection IDT and the pair number N1 of the input/output IDT satisfying the following formula $$0.542 - 0.021(h/L) + 0.029(h/L)^2 \leq N2/N1 \leq 0.734 - 0.028(h/L) + 0.029(h/L)^2,$$

the pair number N1 of the input/output IDT satisfying the following formula $$43 - 11(h/L) \leq N1 \leq 61 - 11(h/L).$$

8. A surface acoustic wave device according to claim 7, wherein a ratio N2/N1 of the pair number N2 of the connection IDT and the pair number N1 of the input/output IDT satisfying the following formula $$0.597 - 0.020(h/L) + 0.027(h/L)^2 \leq N2/N1 \leq 0.690 - 0.032(h/L) + 0.031(h/L)^2,$$

the pair number N1 of the input/output IDT satisfies the following formula $$50 - 11(h/L) \leq N1 \leq 59 - 11(h/L).$$

9. A surface acoustic wave device comprising:

a piezoelectric substrate;

a first electrode structure row formed on the piezoelectric substrate, and including N1 pairs of input/output IDT, N2 pairs of a connection IDT disposed near one side of the input/output IDT, and two reflectors disposed outside the input/output IDT and the connection IDT; and a second electrode structure row formed on the piezoelectric substrate, and including N1 pairs of input/output IDT, N2 pairs of a connection IDT disposed near one side of the input/output IDT, and two reflectors disposed outside the input/output IDT and the connection IDT, the second electrode structure row being cascade-connected to the first electrode structure row, the connection IDT of the first electrode structure row, and the connection IDT of the second electrode structure row being arranged electrically symmetric with respect to the cascade-connected plane, the pair number N1 of the input/output IDT being different from the pair number N2 of the connection IDT, when complex conjugate image impedances Zo at a frequency fo at the center frequency fo of a passband is represented by Zo=R(fo)+jI(fo), and further the normalized frequency axis is divided in n sections within the passband, and a complex conjugate image impedance Z(fi) at each frequency point fi is represented by Z(fi)=R(fi)+jI(fi) (i=1, 2, 3, . . . , n), a square deviation of normalized complex conjugate image impedance DCII expressed by the following formula $$DCII = \left\{ \sum_{i=1}^{n} (R(fi) - R(fo))^2 \right\}^{1/2} /(nR(fo)) +$$

$$\left\{ \sum_{i=1}^{n} (I(fi) - I(fo))^2 \right\}^{1/2} /(nI(fo))$$

satisfies the following formula $$0 \leq DCII \leq 0.2.$$

10. A surface acoustic wave device according to claim 9, wherein the square deviation of normalized complex conjugate image impedance DCII satisfies $$0 \leq DCII \leq 0.13.$$

11. A surface acoustic wave device according to any one of claims 1 to 10, wherein the piezoelectric substrate is a lithium tetraborate substrate.

12. A surface acoustic wave device comprising:

a piezoelectric substrate;

a first electrode structure row formed on the piezoelectric substrate, and including N1 pairs of input/output IDT, N2 pairs of a connection IDT disposed near the input/output IDT, and two reflectors disposed outside the input/output IDT and the connection IDT; and a second electrode structure row formed on the piezoelectric substrate, and including N1 pairs of input/output IDT, N2 pairs of a connection IDT disposed near the input/output IDT, and two reflectors disposed outside the input/output IDT and the connection IDT, the second electrode structure row being cascade-connected to the first electrode structure row, the connection IDT of the first electrode structure row, and the connection IDT of the second electrode structure row being arranged electrically symmetric with respect to the cascade-connected plane, the pair number N1 of the input/output IDT being different from the pair number N2 of the connection IDT, when complex conjugate image impedances Zo at the center frequency fo of a passband is represented by Zo=R(fo)+jI(fo), and further the normalized frequency axis is divided in n sections within the passband, and a complex conjugate image impedance Z(fi) at each frequency point fi is represented by Z(fi)=R(fi)+jI(fi) (i=1, 2, 3, . . . , n), a square deviation of normalized complex conjugate image impedance DCII expressed by the following formula $$DCII = \left\{ \sum_{i=1}^{n} (R(fi) - R(fo))^2 \right\}^{1/2} (nR(fo)) +$$

$$\left\{ \sum_{i=1}^{n} (I(fi) - I(fo))^2 \right\}^{1/2} /(nI(fo))$$

satisfies the following formula $$0 \leq DCII \leq 0.2.$$

13. A surface acoustic wave device according to claim 12 wherein the square deviation of normalized complex conjugate image impedance DCII satisfies $$0 \leq DCII \leq 0.13.$$

14. A surface acoustic wave device comprising:
  a piezoelectric substrate;
  a first electrode structure row formed on the piezoelectric substrate, and including N1 pairs of input/output IDT, N2 pairs of a connection IDT disposed near the input/output IDT, and two reflectors disposed outside the input/output IDT and the connection IDT; and
  a second electrode structure row formed on the piezoelectric substrate, and including N1 pairs of input/output IDT, N2 pairs of a connection IDT disposed near the input/output IDT, and two reflectors disposed outside the input/output IDT and the connection IDT, the second electrode structure row being cascade-connected to the first electrode structure row,
  the connection IDT of the first electrode structure row, and the connection IDT of the second electrode structure row being arranged electrically symmetric with respect to the cascade-connected plane,
  the pair number N1 of the input/output IDT being different from the pair number N2 of the connection IDT,
  when a normalized electrode film thickness of the input/output IDT and the connection IDT is represented by h/L, the pair number N1 of the input/output IDT satisfying the following formula $$43-11(h/L) \leq N1 \leq 61-11(h/L).$$

15. A surface acoustic wave device according to claim 14, wherein
  the pair number N1 of the input/output IDT satisfies the following formula $$50-11(h/L) \leq N1 \leq 59-11(h/L).$$

16. A surface acoustic wave device comprising:
  a piezoelectric substrate;
  a first electrode structure row formed on the piezoelectric substrate, and including N1 pairs of input/output IDT, N2 pairs of a connection IDT disposed near the input/output IDT, and two reflectors disposed outside the input/output IDT and the connection IDT; and
  a second electrode structure row formed on the piezoelectric substrate, and including N1 pairs of input/output IDT, N2 pairs of a connection IDT disposed near the input/output IDT, and two reflectors disposed outside the input/output IDT and the connection IDT, the second electrode structure row being cascade-connected to the first electrode structure row,
  the connection IDT of the first electrode structure row, and the connection IDT of the second electrode structure row being arranged electrically symmetric with respect to the cascade-connected plane,
  the pair number N1 of the input/output IDT being different from the pair number N2 of the connection IDT,
  when a normalized electrode film thickness of the input/output IDT and the connection IDT is represented by h/L, a ratio N2/N1 between the pair number N2 of the connection IDT and the pair number N1 of the input/output IDT satisfying the following formula $$0.542-0.021(h/L)+0.029(h/L)^2 \leq N2/N1 \leq 0.734-0.028(h/L)+0.029(h/L)^2.$$

17. A surface acoustic wave device according to claim 16, wherein
  a ratio N2/N1 of the pair number N2 of the connection IDT and the pair number N1 of the input/output IDT satisfying the following formula $$0.597-0.020(h/L)+0.027(h/L)^2 \leq N2/N1 \leq 0.690-0.032(h/L)+0.031(h/L)^2.$$

18. A surface acoustic wave device comprising:
  a piezoelectric substrate;
  a first electrode structure row formed on the piezoelectric substrate, and including N1 pairs of input/output IDT, N2 pairs of a connection IDT disposed near the input/output IDT, and two reflectors disposed outside the input/output IDT and the connection IDT; and
  a second electrode structure row formed on the piezoelectric substrate, and including N1 pairs of input/output IDT, N2 pairs of a connection IDT disposed near the input/output IDT, and two reflectors disposed outside the input/output IDT and the connection IDT, the second electrode structure row being cascade-connected to the first electrode structure row,
  the connection IDT of the first electrode structure row, and the connection IDT of the second electrode structure row being arranged electrically symmetric with respect to the cascade-connected plane,
  the pair number N1 of the input/output IDT being different from the pair number N2 of the connection IDT,
  when a normalized electrode film thickness of the input/output IDT and the connection IDT is represented by h/L, a ratio N2/N1 between the pair number N2 of the connection IDT and the pair number N1 of the input/output IDT satisfying the following formula $$0.542-0.021(h/L)+0.029(h/L)^2 \leq N2/N1 \leq 0.734-0.028(h/L)+0.029(h/L)^2,$$

the pair number N1 of the input/output IDT satisfying the following formula $$43-11(h/L) \leq N1 \leq 61-11(h/L).$$

19. A surface acoustic wave device according to claim 18, wherein
  a ratio N2/N1 of the pair number N2 of the connection IDT and the pair number N1 of the input/output IDT satisfying the following formula $$0.597-0.020(h/L)+0.027(h/L)^2 \leq N2/N1 \leq 0.690-0.032(h/L)+0.031(h/L)^2,$$

the pair number N1 of the input/output IDT satisfies the following formula $$50-11(h/L) \leq N1 \leq 59-11(h/L).$$

20. A surface acoustic wave device according to any one of claims 12 to 13, wherein
  the piezoelectric substrate is a lithium tetraborate substrate.

21. A surface acoustic wave device comprising:
  a piezoelectric substrate;
  a first electrode structure row formed on the piezoelectric substrate, and including N1 pairs of input/output IDT, N2 pairs of a connection IDT disposed near one side of the input/output IDT, and two reflectors disposed outside the input/output IDT and the connection IDT; and
  a second electrode structure row formed on the piezoelectric substrate, and including N1 pairs of input/output IDT, N2 pairs of a connection IDT disposed near one side of the input/output IDT, and two reflectors disposed outside the input/output IDT and the connection IDT, the second electrode structure being cascade-connected to the first electrode structure row, the connection IDT of the first electrode structure row, and the connection IDT of the second electrode structure row being arranged electrically symmetric with respect to the cascade-connected plane, when the surface acoustic wave device is represented by an electrically symmetric lattice-type circuit including a lattice arm impedance and a serial arm impedance, a ratio $N2/N1$ of the pair number $N2$ of the connection IDT and the pair number $N1$ of the input/output IDT being determined so that a passband is formed by using at least one resonance point and at least one antiresonance point of the lattice arm impedance, and at least one resonance point and at least one antiresonance point of the serial arm impedance, the pair number $N1$ of the input/output IDT being different from the pair number $N2$ of the connection IDT.

22. A surface acoustic wave device according to claim 21, wherein the ratio $N2/N1$ of the pair number $N2$ of the connection IDT and the pair number $N1$ of the input/output IDT is determined so that at least two resonance points and at least one antiresonance point of the lattice arm impedance, and at least two resonance points and at least two antiresonance points of the serial arm impedance are used to form the passband.

23. A surface acoustic wave device according to claim 22, wherein the piezoelectric substrate is a lithium tetraborate substrate.

24. A surface acoustic wave device according to claim 21, wherein the piezoelectric substrate is a lithium tetraborate substrate.

* * * * *